(12) United States Patent
Chida

(10) Patent No.: US 10,241,630 B2
(45) Date of Patent: Mar. 26, 2019

(54) FUNCTIONAL PANEL, FUNCTIONAL MODULE, LIGHT-EMITTING MODULE, DISPLAY MODULE, LOCATION DATA INPUT MODULE, LIGHT-EMITTING DEVICE, LIGHTING DEVICE, DISPLAY DEVICE, DATA PROCESSING DEVICE, AND MANUFACTURING METHOD OF FUNCTIONAL PANEL

(71) Applicant: Semiconductor Energy Laboratory Co., Ltd., Atsugi-shi, Kanagawa-ken (JP)

(72) Inventor: Akihiro Chida, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 472 days.

(21) Appl. No.: 15/041,426

(22) Filed: Feb. 11, 2016

(65) Prior Publication Data
US 2016/0239124 A1 Aug. 18, 2016

(30) Foreign Application Priority Data
Feb. 13, 2015 (JP) .................................. 2015-026317

(51) Int. Cl.
*G06F 3/044* (2006.01)
*G06F 1/16* (2006.01)
*G06F 3/041* (2006.01)
*B32B 38/10* (2006.01)
*B32B 38/00* (2006.01)
(Continued)

(52) U.S. Cl.
CPC ................ *G06F 3/044* (2013.01); *G06F 1/16* (2013.01); *G06F 3/0416* (2013.01); *B32B 38/0004* (2013.01); *B32B 38/10* (2013.01); *B32B 2457/208* (2013.01); *G06F 3/0412* (2013.01); *G06F 2203/04102* (2013.01); *G06F 2203/04103* (2013.01); *H05K 1/118* (2013.01); *H05K 3/323* (2013.01); *H05K 2201/10106* (2013.01); *H05K 2201/10128* (2013.01)

(58) Field of Classification Search
None
See application file for complete search history.

(56) References Cited

U.S. PATENT DOCUMENTS 6,197,663 B1 3/2001 Chandross et al.
6,343,171 B1 1/2002 Yoshimura et al.
(Continued)

FOREIGN PATENT DOCUMENTS

JP 2012-190794 10/2012

*Primary Examiner* — Christopher J Kohlman
(74) *Attorney, Agent, or Firm* — Fish & Richardson P.C.

(57) ABSTRACT

Provided is a novel functional panel that is highly convenient or reliable, a manufacturing method of the novel functional panel that is highly convenient or reliable, a novel light-emitting device that is highly convenient or reliable, or a novel data processing device that is highly convenient or reliable. One embodiment of the present invention includes a release layer, a first base including a region overlapping with the release layer, a terminal between the release layer and the first base, a second base including a region overlapping with the first base, a bonding layer between the first base and the second base. The terminal includes a region not overlapping with the bonding layer.

25 Claims, 18 Drawing Sheets

(51) Int. Cl.
*H05K 1/11* (2006.01)
*H05K 3/32* (2006.01)

(56) References Cited

U.S. PATENT DOCUMENTS

| | | |
|---|---|---|
| 6,515,428 B1 | 2/2003 | Yeh et al. |
| 6,522,066 B2 | 2/2003 | Sheu et al. |
| 6,614,174 B1 | 9/2003 | Urabe et al. |
| 6,738,034 B2 | 5/2004 | Kaneko et al. |
| 6,747,638 B2 | 6/2004 | Yamazaki et al. |
| 6,849,877 B2 | 2/2005 | Yamazaki et al. |
| 6,894,431 B2 | 5/2005 | Yamazaki et al. |
| 7,189,631 B2 | 3/2007 | Yamazaki et al. |
| 7,311,953 B2 | 12/2007 | Araya et al. |
| 7,402,945 B2 | 7/2008 | Yamazaki et al. |
| 7,674,650 B2 | 3/2010 | Akimoto et al. |
| 7,692,610 B2 | 4/2010 | Kimura |
| 8,059,109 B2 | 11/2011 | Yamazaki et al. |
| 8,222,666 B2 | 7/2012 | Hatano et al. |
| 8,284,369 B2 | 10/2012 | Chida et al. |
| 8,289,052 B2 | 10/2012 | Kawae |
| 8,377,762 B2 | 2/2013 | Eguchi et al. |
| 8,383,470 B2 | 2/2013 | Akimoto et al. |
| 8,956,891 B2 | 2/2015 | Chida et al. |
| 8,968,822 B2 | 3/2015 | Yamazaki et al. |
| 9,196,813 B2 | 11/2015 | Chida et al. |
| 2001/0015618 A1 | 8/2001 | Yamazaki et al. |
| 2009/0114915 A1 | 5/2009 | Toriumi |
| 2010/0006845 A1 | 1/2010 | Seo et al. |
| 2010/0045919 A1 | 2/2010 | Chida et al. |
| 2010/0055833 A1 | 3/2010 | Uchida et al. |
| 2010/0110041 A1 | 5/2010 | Jang |
| 2010/0117072 A1 | 5/2010 | Ofuji et al. |
| 2011/0084265 A1 | 4/2011 | Arasawa et al. |
| 2011/0175101 A1 | 7/2011 | Hatano et al. |
| 2011/0278572 A1 | 11/2011 | Koyama |
| 2011/0316013 A1 | 12/2011 | Boerner |
| 2012/0052606 A1 | 3/2012 | Yamazaki |
| 2012/0061673 A1 | 3/2012 | Yamazaki et al. |
| 2012/0061677 A1* | 3/2012 | Miyake ............... H01L 27/1225 257/72 |
| 2012/0205675 A1 | 8/2012 | Yamazaki et al. |
| 2012/0217516 A1 | 8/2012 | Hatano et al. |
| 2012/0287027 A1 | 11/2012 | Koyama |
| 2013/0033475 A1 | 2/2013 | Miyake |
| 2013/0240855 A1* | 9/2013 | Chida ................. H01L 51/5237 257/40 |
| 2014/0077199 A1 | 3/2014 | Yamazaki et al. |
| 2014/0326988 A1* | 11/2014 | Yamaguchi ........... H05B 33/02 257/40 |
| 2015/0111005 A1* | 4/2015 | Hosomi ................ G03F 7/0002 428/174 |
| 2015/0227248 A1* | 8/2015 | Yamazaki ............ G06F 3/0412 345/173 |
| 2015/0243922 A1 | 8/2015 | Yamazaki et al. |

\* cited by examiner

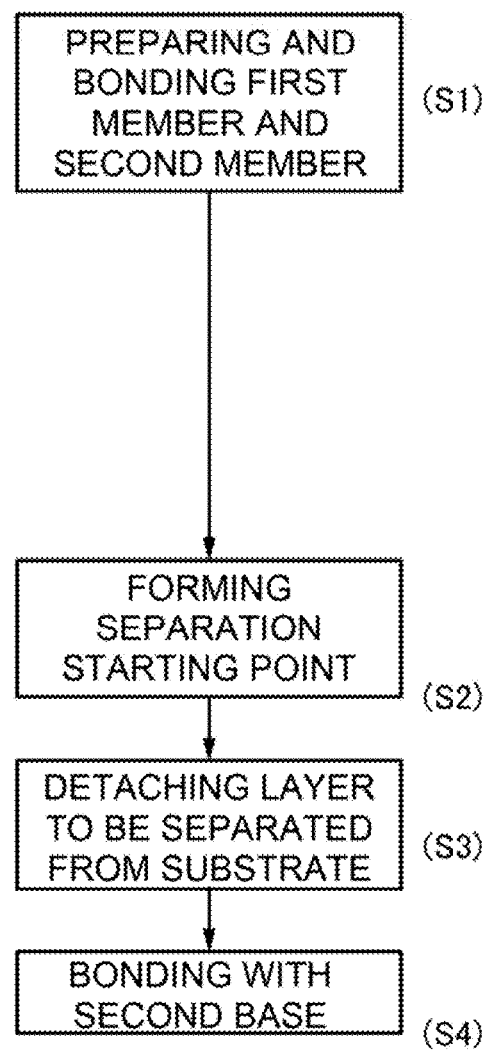

FIG. 4A1
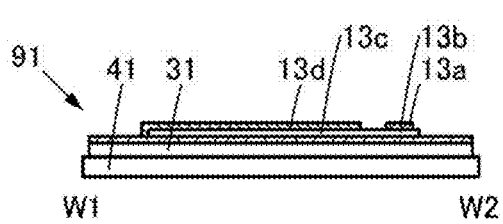
FIG. 4A2
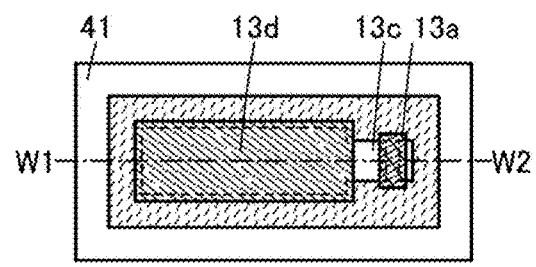
FIG. 4B1
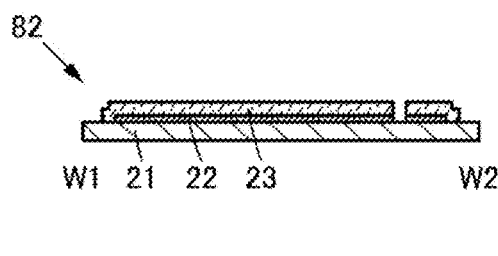
FIG. 4B2
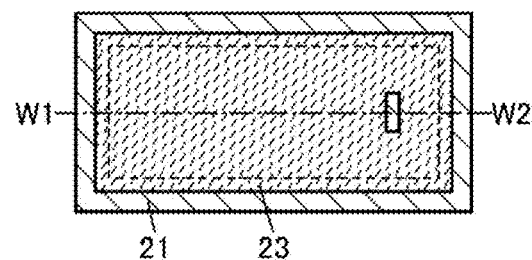
FIG. 4C1
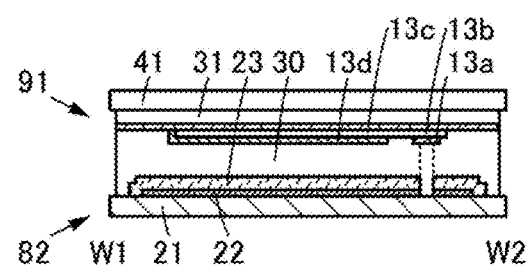
FIG. 4C2
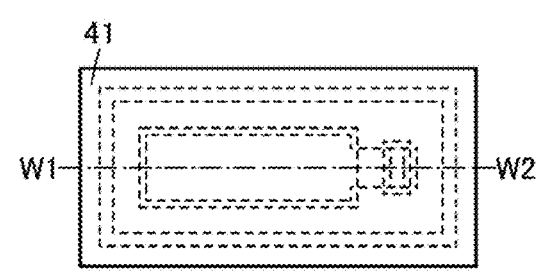

FIG. 5A1
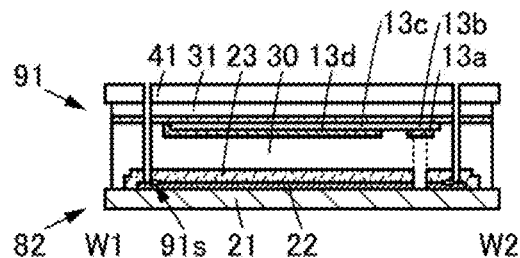
FIG. 5A2
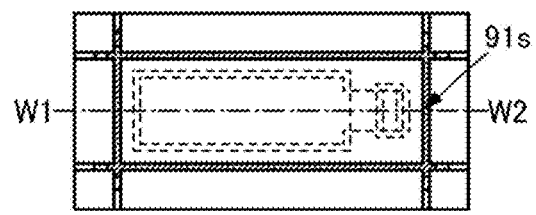
FIG. 5B
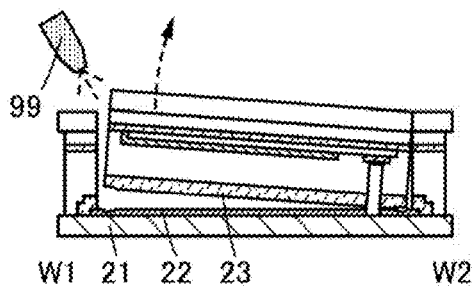
FIG. 5C1
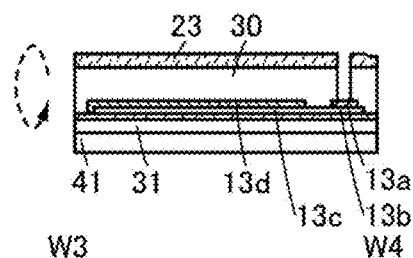
FIG. 5C2
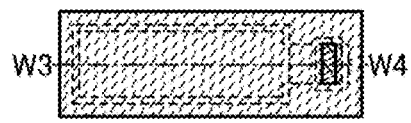
FIG. 5D1
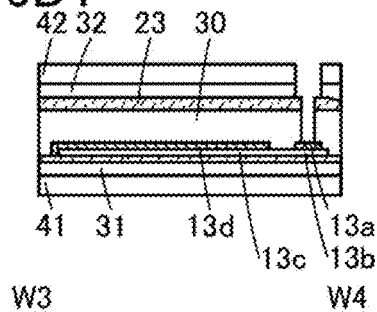
FIG. 5D2
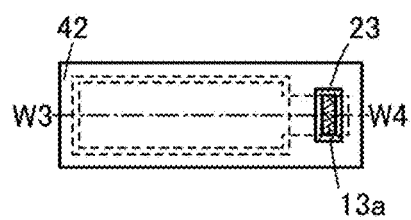

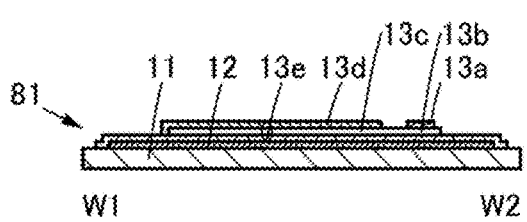
FIG. 7A1
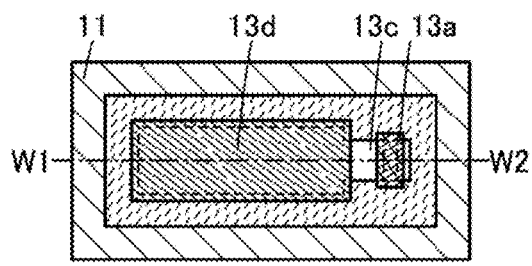
FIG. 7A2
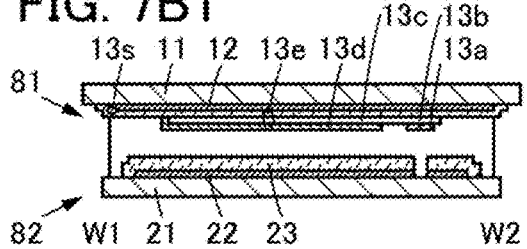
FIG. 7B1
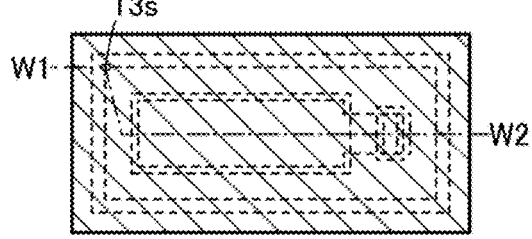
FIG. 7B2
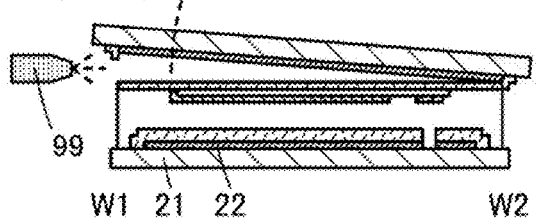
FIG. 7C
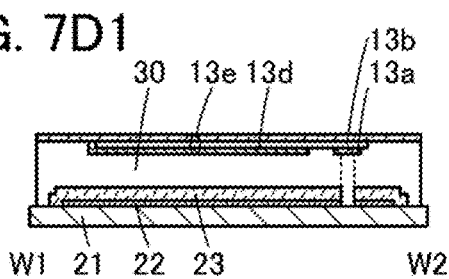
FIG. 7D1
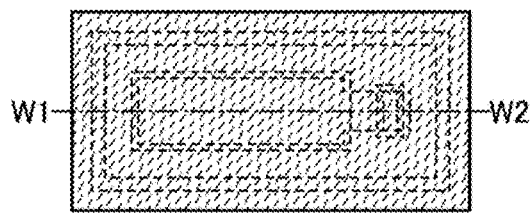
FIG. 7D2
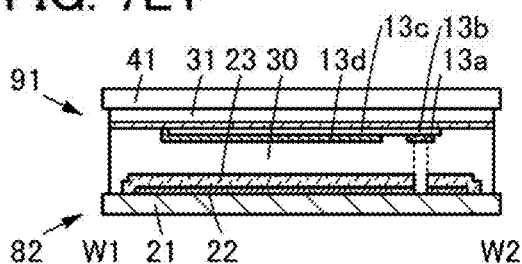
FIG. 7E1
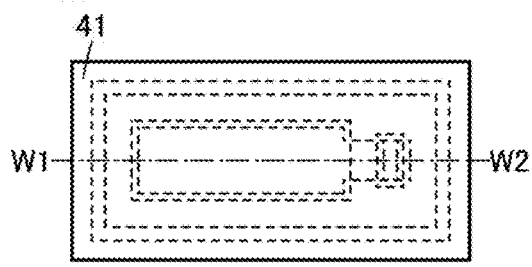
FIG. 7E2

FIG. 8A1
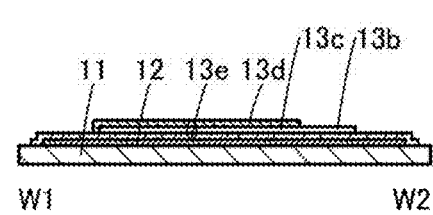
FIG. 8A2
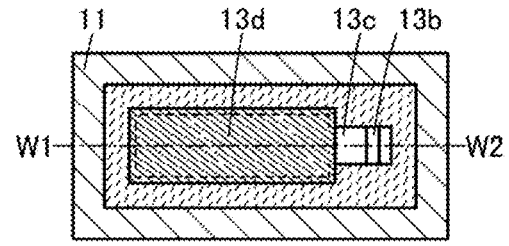
FIG. 8B1
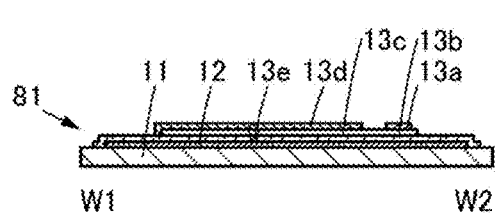
FIG. 8B2
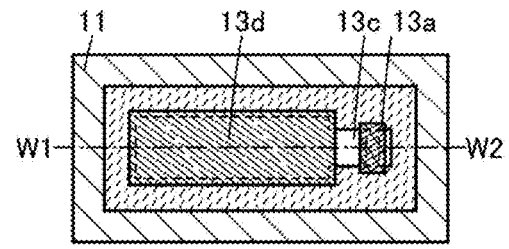

FIG. 9A1
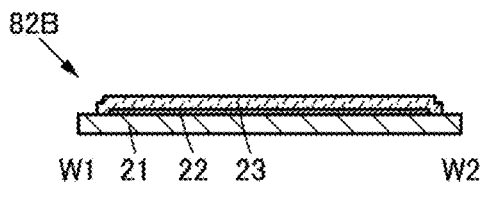
FIG. 9A2
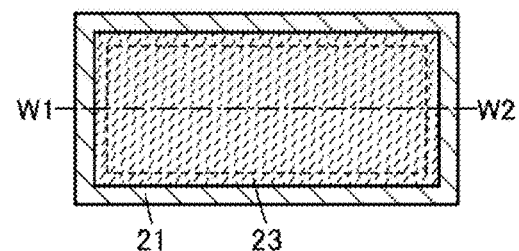
FIG. 9B1
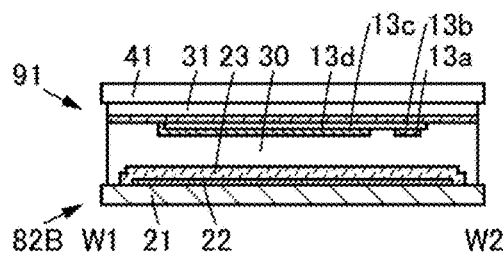
FIG. 9B2
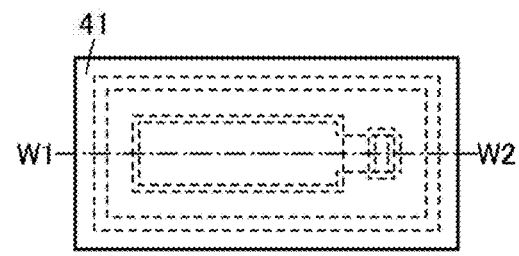
FIG. 9C
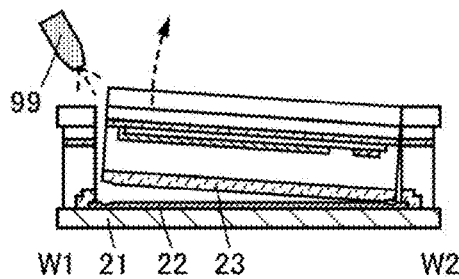
FIG. 9D1
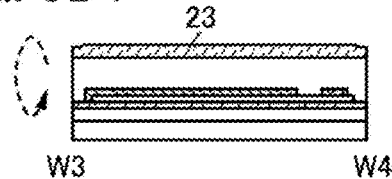
FIG. 9D2
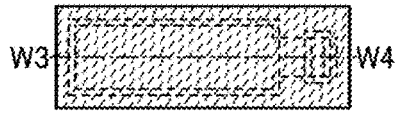

FIG. 10A1
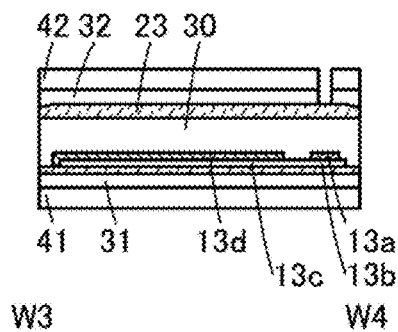
FIG. 10A2
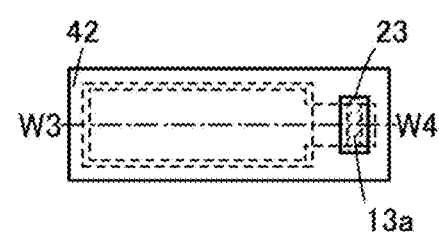
FIG. 10B1
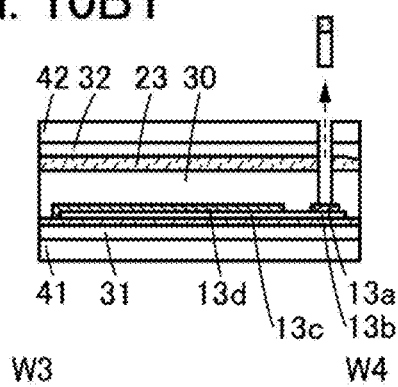
FIG. 10B2
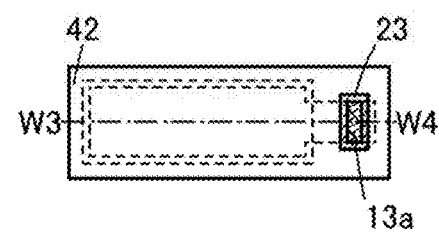

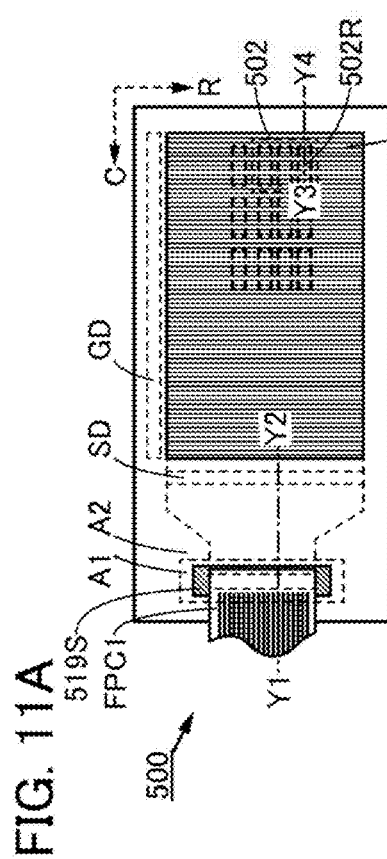
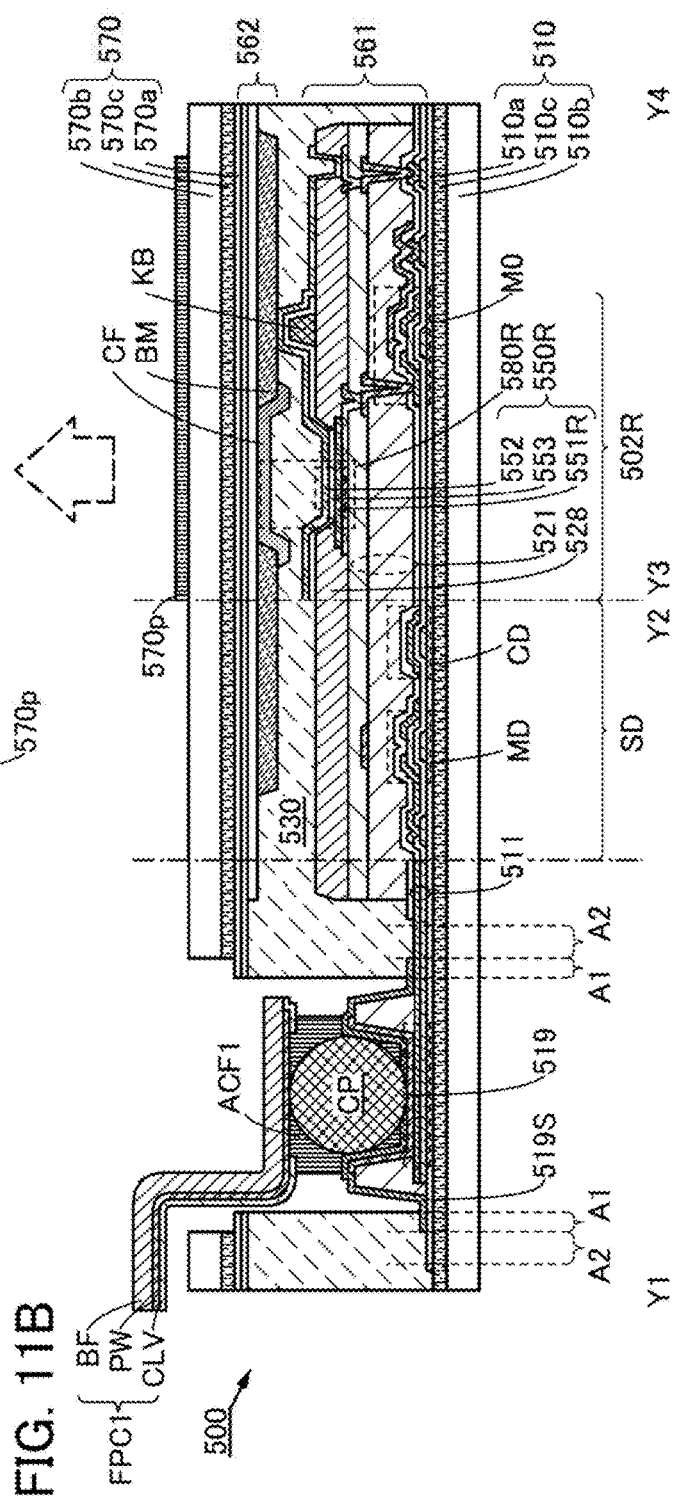
FIG. 11A
FIG. 11B

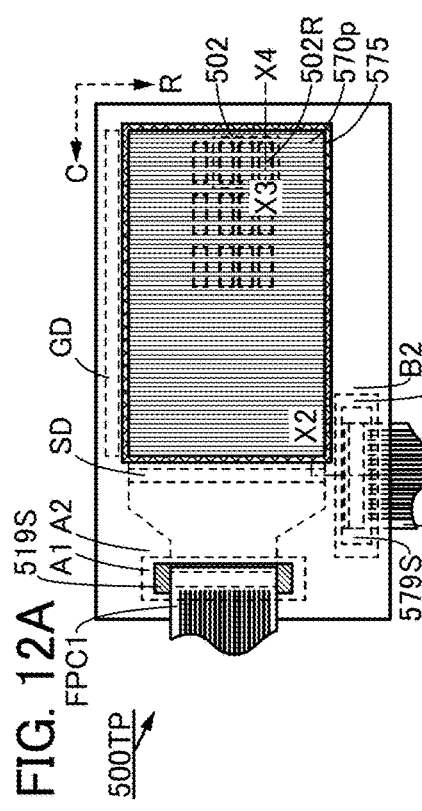
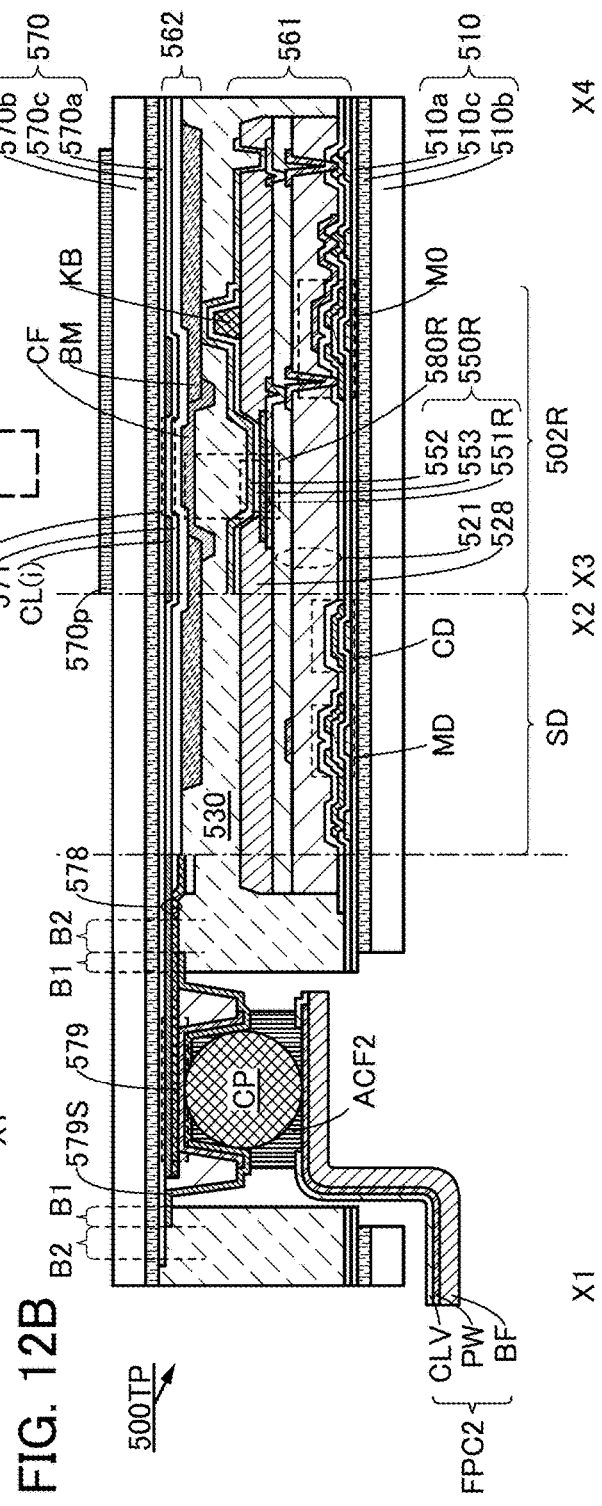
FIG. 12A
FIG. 12B

FIG. 18A
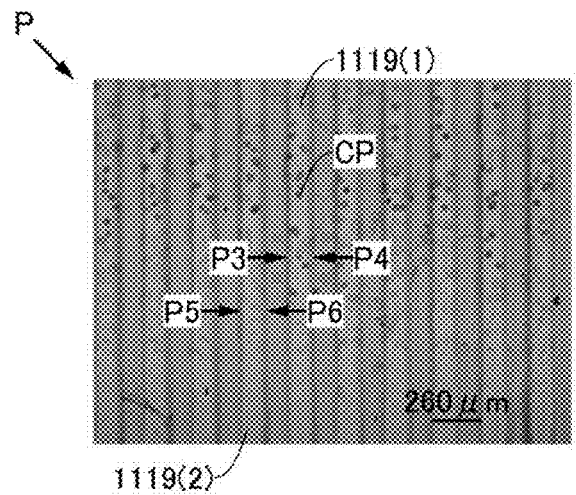
FIG. 18B1
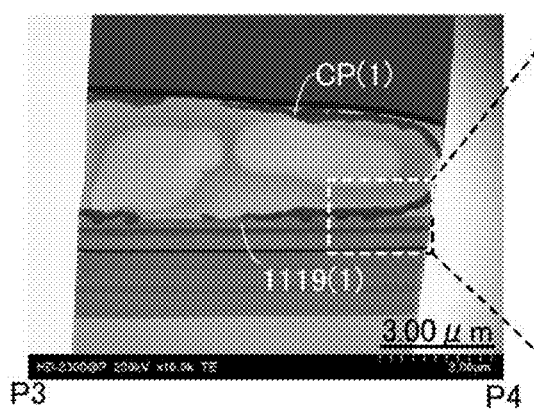
FIG. 18B2
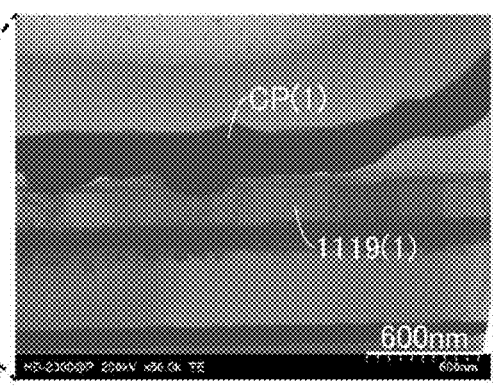
FIG. 18C1
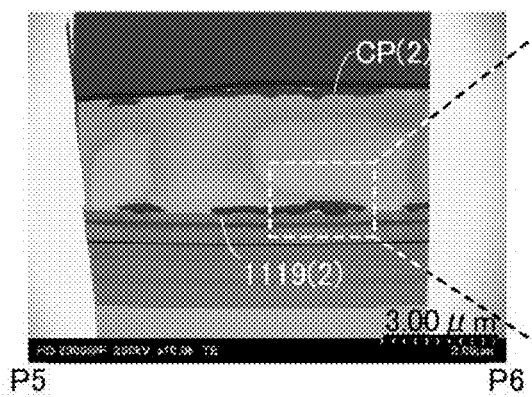
FIG. 18C2
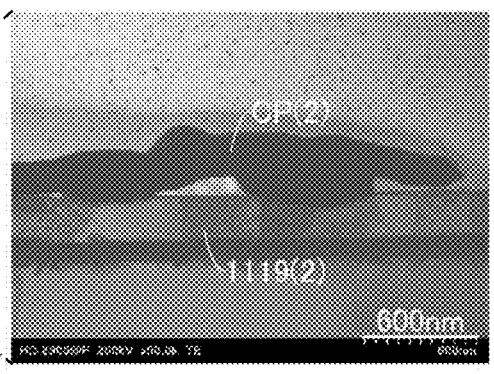

FUNCTIONAL PANEL, FUNCTIONAL MODULE, LIGHT-EMITTING MODULE, DISPLAY MODULE, LOCATION DATA INPUT MODULE, LIGHT-EMITTING DEVICE, LIGHTING DEVICE, DISPLAY DEVICE, DATA PROCESSING DEVICE, AND MANUFACTURING METHOD OF FUNCTIONAL PANEL

BACKGROUND OF THE INVENTION

1. Field of the Invention

One embodiment of the present invention relates to a functional panel, a functional module, a light-emitting module, a display module, a location data input module, a light-emitting device, a lighting device, a display device, a data processing device, or a manufacturing method of the functional panel.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

The social infrastructures relating to means for transmitting information have advanced. This has made it possible to acquire, process, and send out many pieces and various kinds of information with the use of a data processing device not only at home or office but also at other visiting places.

On the background of such a situation, portable data processors are under active development.

For example, portable data processors are often used while being carried around by a user, and force might be accidentally applied, by dropping, to the data processors and display devices included in them. As an example of a display device that is not easily broken, a display device having high adhesiveness between a structure body by which a light-emitting layer is divided and a second electrode layer is known (Patent Document 1).

REFERENCE

Patent Document

[Patent Document 1] Japanese Published Patent Application No. 2012-190794

SUMMARY OF THE INVENTION

An object of one embodiment of the present invention is to provide a novel functional panel that is highly convenient or reliable. Another object is to provide a novel functional module that is highly convenient or reliable, light-emitting module, display module, or location data input module. Another object is to provide a manufacturing method of the novel functional panel that is highly convenient or reliable. Another object is to provide a novel light-emitting device that is highly convenient or reliable, display device, or data processing device. Another object is to provide a novel functional panel. Another object is to provide a novel functional module, light-emitting module, display module, or location data input module. Another object is to provide a manufacturing method of the novel functional panel. Another object is to provide a novel display panel, a novel light-emitting device, a novel data processor, or a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a functional panel including a release layer, a first base including a region overlapping with the release layer, a terminal between the release layer and the first base, a second base including a region overlapping with the first base, a bonding layer between the first base and the second base, and a functional layer between the first base and the bonding layer.

The functional layer includes a functional element. The functional element is electrically connected to the terminal.

One embodiment of the present invention is a functional panel including a terminal, a wiring electrically connected to the terminal, a first base including a region overlapping with the terminal and a region overlapping with the wiring, a second base including a region overlapping with the first base, a bonding layer between the first base and the second base, a release layer between the first base and the bonding layer, and a functional layer between the first base and the bonding layer.

The release layer is provided between the wiring and the bonding layer. The functional layer includes a functional element. The functional element is electrically connected to the wiring.

The functional panel of one embodiment of the present invention includes the release layer, the first base including the region overlapping with the release layer, the terminal between the release layer and the first base, the second base including the region overlapping with the first base, the bonding layer between the first base and the second base. The terminal includes a region not overlapping with the bonding layer.

With the structure, a signal or an electric power is supplied to the terminal which is provided between the release layer and the first base so as not to overlap with the bonding layer, and is supplied to the functional element included in the functional layer which is provided between the first base and the bonding layer. Thus, a novel functional panel that is highly convenient or reliable is provided.

In addition, the functional panel of one embodiment of the present invention includes a first region in which the release layer is provided between the first base and the bonding layer, and a second region which is adjacent to the first region and in which the release layer is not provided between the first base and the bonding layer.

A force required to detach the bonding layer in the first region from the first base is greater than or equal to $\frac{1}{10}$ times and smaller than 1 time a force required to detach the bonding layer in the second region from the first base.

A force required to detach the bonding layer in the first region from the first base is greater than or equal to 0.5 N and smaller than or equal to 8.0 N.

With the structure, the bonding layer in a region overlapping with the release layer can be selectively detached from the first base while preventing the terminal from breaking. Thus, a novel functional panel that is highly convenient or reliable is provided.

One embodiment of the present invention is the functional panel in which the release layer has a water contact angle of more than or equal to 90° and less than 180°.

One embodiment of the present invention is the functional panel in which the release layer contains a fluorine-containing group.

With the structure, the bonding layer has a thickness less than or equal to 100 µm, preferably less than or equal to 50 µm, further preferably less than or equal to 10 µm, and the release layer has a thickness less than the thickness of the bonding layer. Thus, a novel functional panel that is highly convenient or reliable is provided.

One embodiment of the present invention is a manufacturing method of the functional panel including a first step to a fourth step.

In the first step, a first member and a second member are prepared, and the first member and the second member are bonded to each other.

Note that the first member includes a terminal, a wiring, a first base, a release layer, and a functional layer. The wiring is electrically connected to the terminal. The first base includes a region overlapping with the terminal and a region overlapping with the wiring. The release layer includes a region overlapping with the terminal. The terminal is provided between the release layer and the first base. The functional layer includes a region overlapping with the first base. The functional layer includes a functional element. The functional element is electrically connected to the wiring.

In addition, the second member includes a substrate, a layer to be separated, and a separation layer. The layer to be separated includes a region overlapping with the substrate. The separation layer is provided between the substrate and the layer to be separated.

In addition, the release layer is provided to overlap with a region where the layer to be separated and the separation layer are not formed, so that the first member and the second member are bonded to each other using the bonding layer which is in contact with the release layer, with the functional layer, and with the region where the layer to be separated and the separation layer are not formed.

In the second step, part of the layer to be separated is detached from the substrate to form a separation starting point.

In the third step, one part of the bonding layer and the layer to be separated are detached from the other part of the bonding layer and the substrate.

In the fourth step, using a resin layer, a second base is bonded to the layer to be separated so that the second base includes a region overlapping with the layer to be separated.

The manufacturing method of a functional panel in one embodiment of the present invention includes the four steps. By this method, the bonding layer in the region overlapping with the release layer is selectively detached from the first base while preventing the terminal from breaking. The manufacturing method of a novel functional panel that is highly convenient or reliable is thus provided.

One embodiment of the present invention is a functional module including the functional panel, a printed circuit board including a region overlapping with the terminal of the functional panel, and a conductive member between the functional panel and the printed circuit board.

The printed circuit board includes a wiring. The conductive member contains a conductive particle. The conductive particle electrically connects the terminal and the wiring with each other.

One embodiment of the present invention is a light-emitting module including the functional panel, a printed circuit board including a region overlapping with the terminal of the functional panel, and a conductive member between the functional panel and the printed circuit board.

In addition, the functional panel includes a light-emitting element. The printed circuit board includes a wiring. The conductive member electrically connects the terminal and the wiring with each other.

One embodiment of the present invention is a display module including the functional panel, a printed circuit board including a region overlapping with the terminal of the functional panel, and a conductive member between the functional panel and the printed circuit board.

In addition, the functional panel includes a display element. The printed circuit board includes a wiring. The conductive member electrically connects the terminal and the wiring with each other.

One embodiment of the present invention is a location data input module including the functional panel, a printed circuit board including a region overlapping with the terminal of the functional panel, and a conductive member between the functional panel and the printed circuit board.

In addition, the functional panel includes a proximity sensor. The printed circuit board includes a wiring. The conductive member electrically connects the terminal and the wiring with each other.

One embodiment of the present invention is a light-emitting device including the light-emitting module and a driver portion electrically connected to the light-emitting module. In addition, the driver portion includes a constant current power supply.

The light-emitting device of one embodiment of the present invention includes the light-emitting module including a light-emitting element, and the driver portion electrically connected to the light-emitting module.

With the structure, an electric power is supplied to the terminal which is provided between the release layer and the first base so as not to overlap with the bonding layer, and is supplied to the functional layer which is provided between the first base and the bonding layer. Thus, a novel light-emitting device that is highly convenient or reliable is provided.

One embodiment of the present invention includes the display module and the driver portion electrically connected to the display module. In addition, the driver portion includes a timing signal generation circuit.

The display device of one embodiment of the present invention includes the display module including a display element, and the driver portion electrically connected to the display module.

With the structure, a signal or an electric power is supplied to the terminal which is provided between the release layer and the first base so as not to overlap with the bonding layer, and is supplied to the functional layer which is provided between the base and the bonding layer. Thus, a novel functional panel that is highly convenient or reliable is provided.

One embodiment of the present invention includes the location data input module, the driver portion electrically connected to the location data input module, and a sensing circuit electrically connected to the driver portion.

The display device of one embodiment of the present invention includes the location data input module including a proximity sensor, and the driver portion electrically connected to a display module.

With the structure, a signal sensed by the proximity sensor is supplied to the conductive particle electrically connected to the terminal which is provided between the release layer and the first base so as not to overlap with the bonding layer, and is supplied to the sensing circuit. Thus, a novel data processing device that is highly convenient or reliable is provided.

According to one embodiment of the present invention, a novel functional panel that is highly convenient or reliable is provided. According to one embodiment of the present invention, a novel functional module that is highly convenient or reliable, light-emitting module, display module, or location data input module is provided. According to one embodiment of the present invention, a manufacturing method of the novel functional panel that is highly convenient or reliable is provided. According to one embodiment of the present invention, a novel light-emitting device that is highly convenient or reliable, display device, or data processing device is provided. According to one embodiment of the present invention, a novel functional panel is provided. According to one embodiment of the present invention, a novel functional module, light-emitting module, display module, or location data input module is provided. According to one embodiment of the present invention, a manufacturing method of the novel functional panel is provided. According to one embodiment of the present invention, a novel light-emitting device, a novel data processor, or a novel semiconductor device is provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 3 is a flow chart showing a manufacturing method of a functional panel according to one embodiment.

FIGS. 4A1, 4A2, 4B1, 4B2, 4C1, and 4C2 are top views and cross-sectional views showing the manufacturing method of a functional panel according to one embodiment.

FIGS. 5A1, 5A2, 5B, 5C1, 5C2, 5D1, and 5D2 are top views and cross-sectional views showing the manufacturing method of a functional panel according to one embodiment.

FIGS. 7A1, 7A2, 7B1, 7B2, 7C, 7D1, 7D2, 7E1, and 7E2 are top views and cross-sectional views showing the manufacturing method of a functional panel according to one embodiment.

FIGS. 8A1, 8A2, 8B1, and 8B2 are top views and cross-sectional views showing a manufacturing method of a release layer according to one embodiment.

FIGS. 9A1, 9A2, 9B1, 9B2, 9C, 9D1, and 9D2 are top views and cross-sectional views showing a manufacturing method of a functional panel according to one embodiment.

FIGS. 10A1, 10A2, 10B1, and 10B2 are top views and cross-sectional views showing a manufacturing method of a functional panel according to one embodiment.

FIGS. 11A and 11B illustrate a structure of a display module according to one embodiment.

FIGS. 12A and 12B illustrate a structure of a touch panel according to one embodiment.

FIGS. 18A, 18B1, 18B2, 18C1, and 18C2 are images showing a structure of a display module according to one example.

DETAILED DESCRIPTION OF THE INVENTION

Figure 1A:
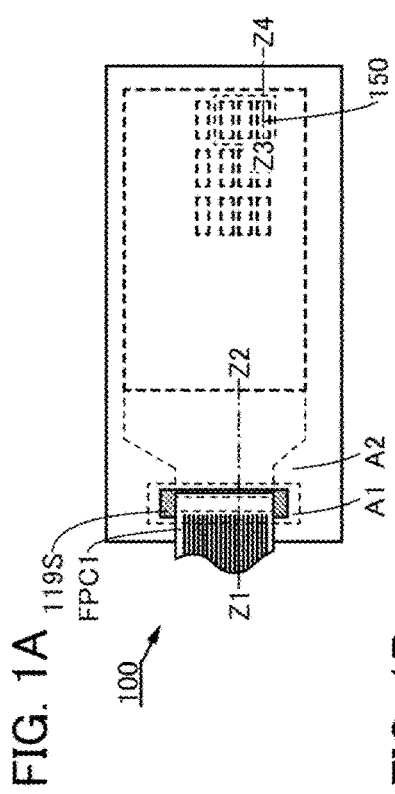
FIGS. 1A and 1B illustrate a structure of a functional panel and a functional module according to one embodiment.

A functional panel of one embodiment of the present invention includes a terminal, a release layer including a region overlapping with the terminal, a first base including a region overlapping with the terminal, a second base including a region overlapping with the first base, a bonding layer between the first base and the second base. The terminal includes a region not overlapping with the bonding layer.

With the structure, a signal or an electric power is supplied to the terminal which is provided between the release layer and the first base so as not to overlap with the bonding layer, and to the functional layer which is provided between the first base and the bonding layer. Thus, a novel functional panel that is highly convenient or reliable is provided.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, structures of a functional panel and a functional module of embodiments of the present invention will be described with reference to FIGS. 1A and 1B.

Figure 1B:
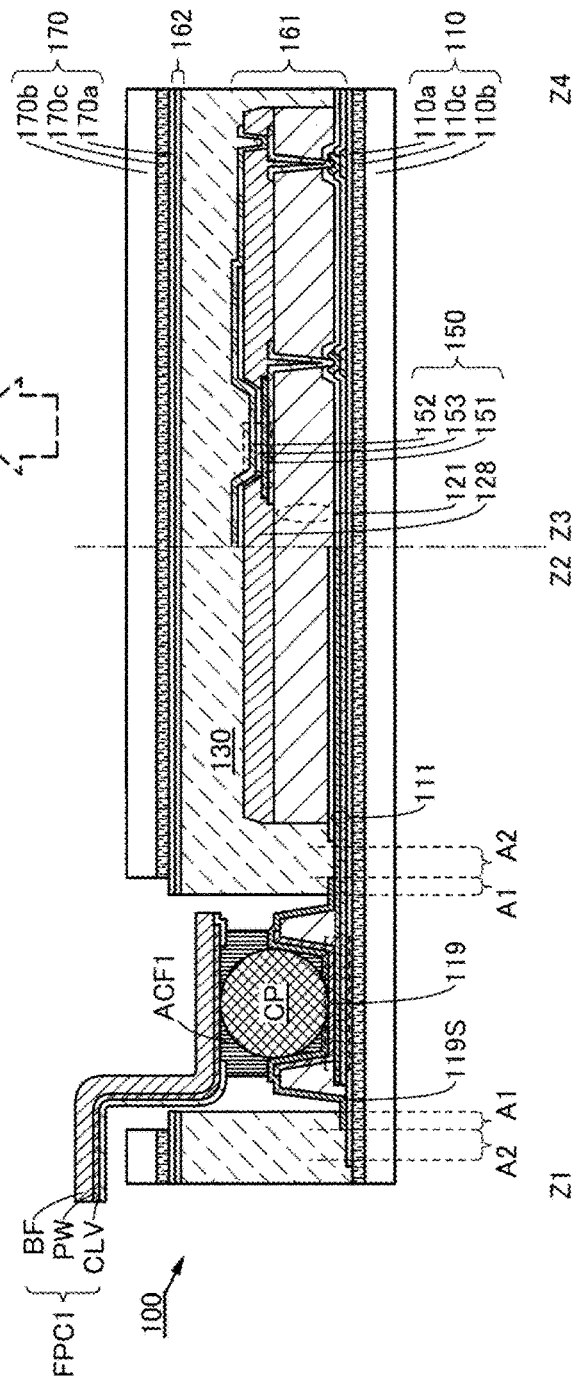

FIGS. 1A and 1B illustrate the structures of the functional panel and the functional module of embodiments of the present invention. FIG. 1A is a top view of the functional panel of one embodiment of the present invention. FIG. 1B is a cross-sectional view taken along section lines Z1-Z2 and Z3-Z4 in FIG. 1A.

<Structure Example 1 of Functional Panel>

A functional panel 100 described in this embodiment includes a release layer 119S, a first base 110 including a region overlapping with the release layer 119S, a terminal 119 between the release layer 119S and the first base 110, a second base 170 including a region overlapping with the first base 110, a bonding layer 130 between the first base 110 and the second base 170, and a functional layer 161 between the first base 110 and the bonding layer 130 (see FIGS. 1A and 1B).

The functional layer 161 includes a functional element which is electrically connected to the terminal 119. For example, a light-emitting element 150 can be used as the functional element.

In another case, the functional panel 100 includes the terminal 119, a wiring 111 electrically connected to the terminal 119, the first base 110 including a region overlapping with the terminal 119 and a region overlapping with the wiring 111, the second base 170 including a region overlapping with the first base 110, the bonding layer 130 between the first base 110 and the second base 170, the release layer 119S between the first base 110 and the bonding layer 130, and the functional layer 161 between the first base 110 and the bonding layer 130.

The release layer 119S is provided between the wiring 111 and the bonding layer 130. The functional layer 161 includes a functional element which is electrically connected to the terminal 119 through the wiring 111.

The functional panel described in this embodiment includes the release layer 119S, the first base 110 including a region overlapping with the release layer 119S, the terminal 119 between the release layer 119S and the first base 110, the second base 170 including a region overlapping with the first base 110, and the bonding layer 130 between the first base 110 and the second base 170. The terminal 119 includes a region not overlapping with the bonding layer 130.

With such a structure, a signal or an electric power is supplied to the terminal 119 which is provided between the release layer 119S and the first base 110 so as not to overlap with the bonding layer 130, and is supplied to the functional element included in the functional layer 161 which is provided between the first base 110 and the bonding layer 130. Thus, a novel functional panel that is highly convenient or reliable is provided.

Note that a functional layer 162 may be provided between the second base 170 and the bonding layer 130.

Note that the terminal 119 can be electrically connected to a flexible printed circuit board FPC1 using, for example, a conductive member ACF1.

For example, the first base 110 can include an insulating film 110a, a base 110b, and a resin layer 110c sandwiched between the insulating film 110a and the base 110b.

For example, the second base 170 can include an insulating film 170a, a base 170b, and a resin layer 170c sandwiched between the insulating film 170a and the base 170b.

The functional layer 161 can include the light-emitting element 150, a partition 128 having an opening in a region overlapping with the light-emitting element 150, and an insulating layer 121 including a region overlapping with the partition 128.

An insulating layer for suppressing the diffusion of impurities can be used as the functional layer 162.

Individual components included in the functional panel 100 will be described below. Note that these components cannot be clearly distinguished and one component serves as another component or include part of another component in some cases.

For example, the insulating film 110a included in the first base 110 is part of the first base 110 and can serve as part of or the whole of the functional layer 161.

In addition, for example, the insulating film 170a included in the second base 170 is part of the second base 170 and can serve as part of or the whole of the functional layer 162.

<<Structure Example>>

The functional panel 100 includes the terminal 119, the wiring 111, the first base 110, the bonding layer 130, the release layer 119S, the functional layer 161, and the second base 170.

<<Wiring 111 and Terminal 119>>

A conductive material can be used for the wiring 111 and the terminal 119.

The terminal 119 is electrically connected to the wiring 111. Part of the wiring 111 can be used as the terminal 119.

Examples of a material which can be used for the wiring 111 or the terminal 119 include an inorganic conductive material, an organic conductive material, a metal material, and a conductive ceramic material.

Specifically, a metal element selected from aluminum, gold, platinum, silver, copper, chromium, tantalum, titanium, molybdenum, tungsten, nickel, iron, cobalt, palladium, and manganese, or the like can be used for the wiring 111 or the terminal 119. Alternatively, an alloy containing any of these metal elements can be used for the wiring 111 or the terminal 119. Further alternatively, an alloy in which some of these metal elements are combined can be used for the wiring 111 or the terminal 119. In particular, an alloy of copper and manganese is suitably used in microfabrication with the use of a wet etching method.

Specifically, the wiring 111 or the terminal 119 can have any of the following structures: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like.

Specifically, a conductive oxide such as indium oxide, indium tin oxide, indium zinc oxide, zinc oxide, or zinc oxide to which gallium is added can be used for the wiring 111 or the terminal 119.

Specifically, a film containing graphene or graphite can be used for the wiring 111 or the terminal 119.

For example, a film containing graphene oxide is formed and is reduced, so that a film containing graphene can be formed. As the reducing method, a method using heat, a method using a reducing agent, or the like can be employed.

Specifically, a conductive high molecule can be used for the wiring 111 or the terminal 119.

<<First Base 110>>

For example, a light-transmitting material can be used for the first base 110.

For example, a material which has a heat resistance high enough to withstand a manufacturing process and a thickness and a size that are applicable to a manufacturing apparatus can be used for the first base 110.

An organic material, an inorganic material, a composite material of an organic material and an inorganic material, or the like can be used for the first base 110. For example, an inorganic material such as glass, ceramic, or metal can be used for the first base 110.

Specifically, non-alkali glass, soda-lime glass, potash glass, crystal glass, or the like can be used for the first base 110. Specifically, an inorganic oxide, an inorganic nitride, an inorganic oxynitride, or the like can be used for the first base 110. For example, silicon oxide, silicon nitride, silicon oxynitride, an alumina, or the like can be used for the first base 110. Stainless steel, aluminum, or the like can be used for the first base 110.

For example, an organic material such as a resin, a resin film, or plastic can be used for the first base 110. Specifically, a resin film or a resin plate of polyester, polyolefin, polyamide, polyimide, polycarbonate, an acrylic resin, or the like can be used for the first base 110.

For example, a composite material such as a resin film to which a metal plate, a thin glass plate, or a film of an inorganic material is attached can be used for the first base 110. For example, a composite material formed by dispersing a fibrous or particulate metal, glass, an inorganic material, or the like into a resin film can be used for the first base 110. For example, a composite material formed by dispersing a fibrous or particulate resin, organic material, or the like into an inorganic material can be used for the first base 110.

Furthermore, a single-layer material or a material in which a plurality of layers are stacked can be used for the first base 110. For example, a stacked-layer material in which a base, an insulating film that prevents diffusion of impurities contained in the base, and the like are stacked can be used for the first base 110. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the first base 110. Alternatively, a material in which a resin, a film which prevents diffusion of impurities contained in the resin, such as a silicon oxide film, a silicon nitride film, or a silicon oxynitride film, and the like are stacked can be used for the first base 110.

For the first base 110, a flexible material can be used. For example, a material with flexibility high enough to be bent or be folded can be used. Specifically, a material which can be bent with a radius of curvature of 5 mm or more, preferably 4 mm or more, further preferably 3 mm or more, particularly preferably 1 mm or more can be used. For the first base 110, a material with a thickness greater than or equal to 2.5 µm and less than or equal to 3 mm, preferably greater than or equal to 5 µm and less than or equal to 1.5 mm, further preferably greater than or equal to 10 µm and less than or equal to 500 µm can be used.

For example, a stack including a flexible base 110b, an insulating film 110a which prevents impurity diffusion, and a resin layer 110c which bonds the base 110b and the insulating film 110a can be used for the first base 110.

Specifically, a film containing a stacked-layer material of a 600-nm-thick silicon oxynitride film and a 200-nm-thick silicon nitride film can be used as the insulating film 110a.

Specifically, a film containing a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the insulating film 110a.

Specifically, a resin film, resin plate, or a stack of polyester, polyolefin, polyamide, polyimide, polycarbonate, an acrylic resin, or the like can be used as the base 110b.

Specifically, materials that contain polyester, polyolefin, polyamide (e.g., nylon or aramid), polyimide, polycarbonate, polyurethane, an acrylic resin, an epoxy resin, or a resin having a siloxane bond such as a silicone can be used for the resin layer 110c.

<<Second Base 170>>

For example, the material that can be used for the first base 110 can be used for the second base 170.

Specifically, the same material can be used for the first base 110 and the second base 170 bonded to each other using the bonding layer 130. With the structure, the functional panel 100 can be prevented from being curled.

For example, a material in which the insulating film 170a for suppressing diffusion of impurities and the base 170b which is flexible are bonded using the resin layer 170c can be used for the second base 170.

<<Bonding Layer 130>>

A material which can bond the first base 110 and the second base 170 can be used for the bonding layer 130.

For the bonding layer 130, an inorganic material, an organic material, a composite material of an inorganic material and an organic material, or the like can be used.

For example, glass with a melting point of 400° C. or lower, preferably 300° C. or lower, can be used for the bonding layer 130.

For example, an organic material, such as a resin having thermal fusibility or a curable resin, can be used for the bonding layer 130.

For example, an organic material, such as a light curable adhesive, a reactive curable adhesive, a thermosetting adhesive, and/or an anaerobic adhesive, can be used for the bonding layer 130.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used for the bonding layer 130.

<<First Region A1 and Second Region A2>>

In addition, the functional panel 100 described in this embodiment includes a first region A1 in which the release layer 119S is provided between the first base 110 and the bonding layer 130, and a second region A2 which is adjacent to the first region A1 and in which the release layer 119S is not provided between the first base 110 and the bonding layer 130 (see FIG. 1B).

A force required to detach the bonding layer 130 in the first region A1 from the first base 110 is greater than or equal to 1/10 times and smaller than 1 time a force required to detach the bonding layer 130 in the second region A2 from the first base 110.

Alternatively, a force required to detach the bonding layer 130 in the first region A1 from the first base 110 is greater than or equal to 0.03 N and smaller than or equal to 8.0 N.

With the structure, the bonding layer 130 in the region overlapping with the release layer 119S can be selectively detached from the first base 110 while preventing the terminal 119 from breaking. Thus, a novel functional panel that is highly convenient or reliable is provided.

<<Release Layer 119S>>

The release layer 119S can have various structures. For example, a single layer structure or a stacked-layer structure including a plurality of layers can be used for the release layer 119S.

For example, the release layer 119S can include a first layer, a second layer stacked over the first layer, and an interface where the first layer and the second layer are in contact with each other. The interface can be broken by a force weaker than a force for a cohesive failure of the bonding layer 130.

Specifically, the release layer 119S can include a first layer containing an organic material, a second layer containing an inorganic material and stacked over the first layer, and an interface where the first layer and the second layer are in contact with each other. For example, a layer containing a light-emitting organic compound can be used as the first layer. A layer containing a conductive inorganic material can be used as the second layer.

Specifically, the structure which is the same as that of an organic electroluminescent element can be used for the release layer 119S. The interface between the electrode and the layer containing a light-emitting organic compound can be broken by a force weaker than a force for a cohesive failure of the bonding layer 130.

Alternatively, for the release layer 119S, a material that can be broken by a force weaker than a force for a cohesive failure of the bonding layer 130 can be used.

Alternatively, for the release layer 119S, a material whose interface with the bonding layer 130 can be broken by a force weaker than a force for a cohesive failure of the bonding layer 130 can be used.

Specifically, a material having a water contact angle of more than or equal to 90° and less than 180° can be used for the release layer 119S. In this case, the bonding layer 130 in the region overlapping with the release layer 119S is selectively detached from the first base 110 while preventing the terminal 119 from breaking.

A material containing a fluorine-containing group can be used for the release layer 119S. In this case, the bonding layer has a thickness less than or equal to 100 μm, preferably less than or equal to 50 μm, further preferably less than or equal to 10 μm, and the release layer has a thickness less than the thickness of the bonding layer.

Specifically, a high molecular compound whose side chain has a perfluoroalkyl group, an acrylic resin whose side chain has a perfluoroalkyl group, a meta-acrylic resin whose side chain has a perfluoroalkyl group, or the like can be used for the release layer 119S. For example, a high molecular compound containing a perfluoroalkyl group in which the number of carbon atoms is more than or equal to 4 and less than or equal to 12, preferably more than or equal to 6 and less than or equal to 12 can be used.

A film which contains an organic compound having a perfluoroalkyl group and has a thickness of 2 μm or less, preferably 0.3 μm or less, more preferably 0.1 μm or less can be used for the release layer 119S.

Thus, the release layer 119S can have a sufficiently smaller thickness than the bonding layer 130, which has a thickness of 100 μm or less, preferably 50 μm or less, more preferably 7 μm or less. As a result, the novel functional panel that is highly convenient or reliable is provided.

<<Functional Layer 161>>

A layer including one or more a functional circuit, a functional element, an optical element, a functional film, and the like can be used for the functional layer 161.

For example, an electric element or a biochip can be used for the functional layer. Specifically, a transistor, a capacitor, a resistor, a memory element, a light-emitting element, a display element, or the like can be used.

For example, a display element and a pixel circuit for driving the display element can be used for the functional layer.

For example, a proximity sensor (a touch sensor), a color filter, a moisture-proof film, or the like can be used as the functional layer.

Note that a functional panel in which the functional layer 161 includes a light-emitting element is also referred to as a light-emitting panel.

In addition, a functional panel in which the functional layer 161 includes a display element is also referred to as a display panel.

Note that a functional panel in which the functional layer 161 includes a proximity sensor is also referred to as a location data input panel.

For example, a light-emitting element can be used for the functional layer 161. Specifically, an organic electroluminescence element, an inorganic electroluminescence element, a light-emitting diode, or the like can be used.

Alternatively, a driver circuit for driving the light-emitting elements can be used for the functional layer.

For example, a display element can be used for the functional layer. Specifically, an electroluminescence (EL) element (e.g., an EL element containing organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric element, or the like can be used.

Alternatively, a pixel circuit for driving the display elements or a driver circuit for driving the pixel circuit can be used for the functional layer 161.

An optical element, such as a color filter, an anti-reflective film, or a polarizing plate can be used for the functional layer 161.

Alternatively, a functional film such as a moisture-proof film can be used for the functional layer 161.

<<Functional Layer 162>>

For example, a layer including one or more of a functional element, a functional circuit, an optical element, a functional film, or the like, which can be used for the functional layer 161, can be used for the functional layer 162.

For example, a functional element which can be combined with the functional element included in the functional layer 161 can be used for the functional layer 162.

Specifically, a display panel can be formed using a display element for the functional layer 161 and using a color filter which includes a region overlapping with a display element of the functional layer 162.

In addition, a touch panel can be formed using a display element and a proximity sensor for the functional layer 161 and the functional layer 162, respectively.

<<Light-Emitting Element 150>>

Various light-emitting elements can be used as the light-emitting element 150. For example, an organic electroluminescence element, an inorganic electroluminescence element, a light-emitting diode, or the like can be used as the light-emitting element 150.

For example, the light-emitting element 150 include a lower electrode 151, an upper electrode 152 including a region overlapping with the lower electrode 151, and a layer 153 which contains a light-emitting organic compound and is provided between the lower electrode 151 and the upper electrode 152.

<<Partition 128 and Insulating Layer 121>>

For example, an insulating inorganic material, an insulating organic material, or an insulating composite material containing an inorganic material or an organic material can be used for the partition 128 or the insulating layer 121.

Specifically, an inorganic oxide film, an inorganic nitride film, an inorganic oxynitride film, or a material stacking any of these films can be used for the partition 128 or the insulating layer 121.

Specifically, for the partition 128, polyester, polyolefin, polyamide, polyimide, polycarbonate, polysiloxane, an acrylic resin, and the like, or a composite material of a plurality of kinds of resins selected from these can be used. Alternatively, a photosensitive material may be used.

For example, the partition 128 can separate the light-emitting element 150 from other components around the light-emitting element 150.

The insulating layer 121 covering steps due to components under the insulating layer 121 can form a flat surface.

<Structure Example of Light-Emitting Module>

A light-emitting module described in this embodiment includes the functional panel 100, the flexible printed circuit board FPC1 including a region overlapping with the terminal 119 of the functional panel 100, and the conductive member ACF1 between the functional panel 100 and the flexible printed circuit board FPC1.

The flexible printed circuit board FPC1 includes a wiring PW. The conductive member ACF1 contains a conductive particle CP. The conductive particle CP electrically connects the terminal 119 and the wiring PW (see FIG. 1B).

The functional layer includes the light-emitting element 150.

<Example of Method for Connecting Printed Circuit>

An example of a method for electrically connecting the flexible printed circuit board FPC1 to the functional panel 100 of one embodiment of the present invention is described with reference to FIGS. 2A to 2C.

Figure 2A:
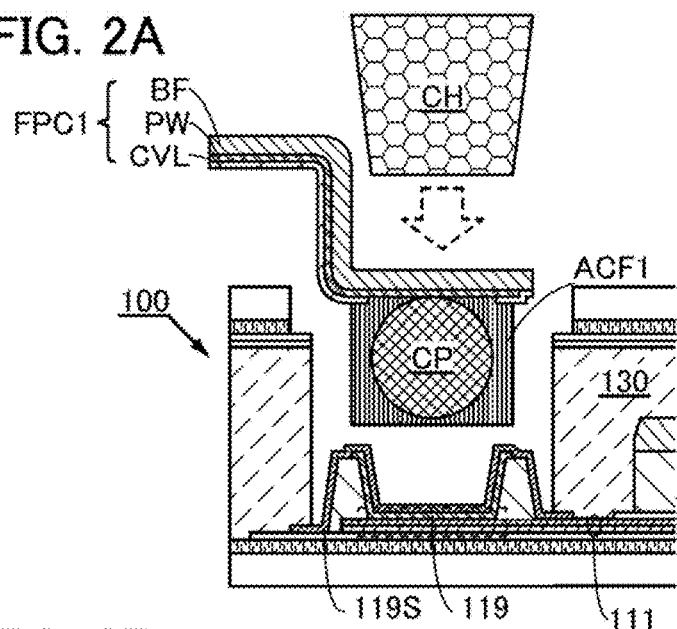
FIGS. 2A, 2B, and 2C illustrate a method of connecting a terminal of a functional panel with a printed circuit board, according to one embodiment.
Figure 2B:
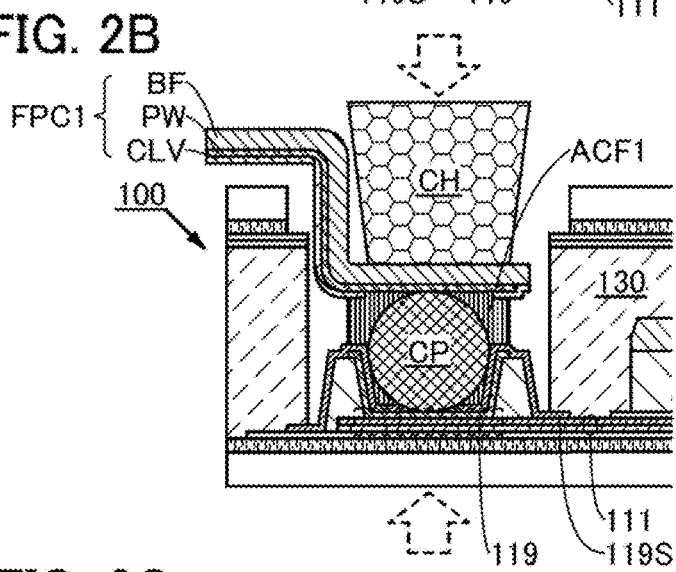
Figure 2C:
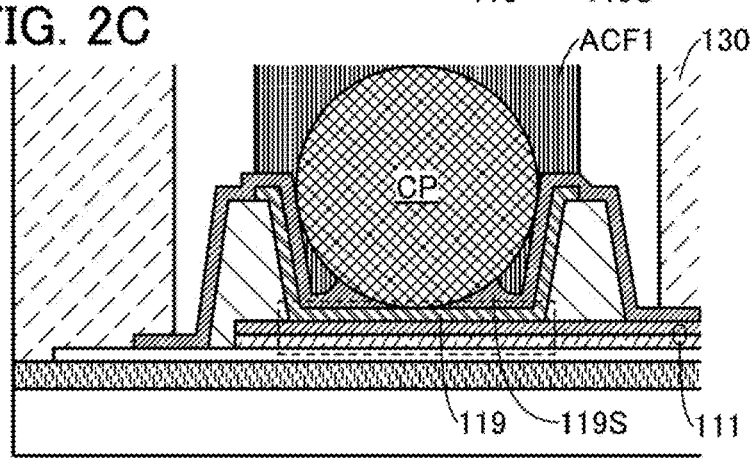

FIGS. 2A to 2C are cross-sectional views illustrating a method for electrically connecting the flexible printed circuit board FPC1 to the functional panel 100 of one embodiment of the present invention.

FIG. 2A is a cross-sectional view of a region including the terminal 119 in the functional panel 100 of one embodiment of the present invention. FIG. 2B is a view illustrating the terminal 119, the flexible printed circuit board FPC1, and the conductive member ACF1 sandwiched between the terminal 119 and the flexible printed circuit board FPC1. In addition, FIG. 2C is a cross-sectional view illustrating a state where the release layer 119S is pressed by the conductive particle CP.

One embodiment of the present invention includes a step of preparing the functional panel 100, the flexible printed circuit board FPC1, and the conductive member ACF1 between the functional panel 100 and the flexible printed circuit board FPC1 and pressing the terminal 119 and the flexible printed circuit board FPC1 onto the conductive member ACF1 (see FIGS. 2A and 2B).

For example, the flexible printed circuit board FPC1 is pressed by a heated pressure-bonding apparatus CH.

Through the steps, the terminal 119 can be electrically connected to a contact point of the flexible printed circuit board FPC1 using the conductive particle CP contained in the conductive member ACF1.

The release layer 119S between the conductive particle CP and the terminal 119 is pressed by the conductive particle CP. The conductive particle CP is electrically connected to the terminal 119 (see FIG. 2C).

<<Printed Circuit Board>>

For example, the flexible printed circuit board can be used as a printed circuit board (see FIG. 1B).

The flexible printed circuit board FPC1 includes the wiring PW electrically connected to the terminal 119, a base BF which supports the wiring PW, and a coating layer CVL which has a region overlapping with the wiring PW. The wiring PW has a region that is sandwiched between the base BF and the coating layer CVL and a region that does not overlap with the coating layer CVL.

The region of the wiring PW not overlapping with the coating layer CVL can be used as a terminal of the flexible printed circuit board FPC1.

A conductive material can be used for the wiring PW of the flexible printed circuit board FPC1. For example, the material that can be used for the wiring 111 or the like can be used for the wiring PW of the flexible printed circuit board FPC1. Specifically, copper or the like can be used.

A material in which an insulating region is formed in a region to be in contact with the wiring PW of the flexible printed circuit board FPC1 can be used for the base BF of the flexible printed circuit board FPC1.

For example, an organic material such as a resin, a resin film, or plastic can be used for the base BF. Specifically, a resin layer, a resin film, or a resin plate of polyester, polyolefin, polyamide, polyimide, polycarbonate, an acrylic resin, or the like can be used for the base. For example, a resin film having a glass transition temperature of higher than or equal to 150° C., preferably higher than or equal to 200° C., further preferably higher than or equal to 250° C. and lower than or equal to 375° C., can be used for the base.

<<Conductive Member>>

For example, solder, a conductive paste, an anisotropic conductive film, or the like can be used for the conductive member.

Specifically, the conductive particle CP and the conductive member ACF1 containing a material for dispersing the particle CP or the like can be used for the conductive member.

For example, a particle having a spherical shape, a columnar shape, a fiber shape, or the like with a size of greater than or equal to 1 μm and smaller than or equal to 200 μm, preferably greater than or equal to 3 μm and smaller than or equal to 150 μm can be used as the particle CP.

For example, a particle coated with a conductive material containing nickel, gold, or the like can be used.

Specifically, a particle containing polystyrene, an acrylic resin, a titanium oxide, or the like can be used.

For example, synthetic rubber, a thermosetting resin, a thermoplastic resin, or the like can be used as the material for dispersing the particle CP.

Using such materials, the terminal of the flexible printed circuit board FPC1 and the terminal 119 can be electrically connected to each other using the particle CP.

Note that this embodiment can be combined with any of the other embodiments in this specification as appropriate.

Embodiment 2

In this embodiment, a method for manufacturing a functional panel of one embodiment of the present invention is described with reference to FIG. 3, FIGS. 4A1, 4A2, 4B1, 4B2, 4C1, and 4C2, FIGS. 5A1, 5A2, 5B, 5C1, 5C2, 5D1, and 5D2, FIG. 6, and FIGS. 7A1, 7A2, 7B1, 7B2, 7C, 7D1, 7D2, 7E1, and 7E2.

FIG. 3 is a flow chart showing a manufacturing method of a functional panel of one embodiment of the present invention. FIGS. 4A1, 4A2, 4B1, 4B2, 4C1, and 4C2 are views showing the manufacturing method of a functional panel of one embodiment of the present invention. FIGS. 5A1, 5A2, 5B, 5C1, 5C2, 5D1, and 5D2 are views showing the manufacturing method of a functional panel of one embodiment of the present invention.

FIG. 4A2 is a top view of a first member used for manufacturing the functional panel. FIG. 4A1 is a cross-sectional view along a section line W1-W2 in FIG. 4A2.

FIG. 4B2 is a top view of a second member used for manufacturing the functional panel. FIG. 4B1 is a cross-sectional view along a section line W1-W2 in FIG. 4B2.

FIG. 4C2 is a top view of a process member during the manufacturing process. FIG. 4C1 is a cross-sectional view along a section line W1-W2 in FIG. 4C2.

FIGS. 5A2, 5C2, and 5D2 are top views of a process member during the manufacturing process. FIG. 5A1 is a cross-sectional view along a section line W1-W2 in FIG. 5A2. FIG. 5C1 is a cross-sectional view along a section line W1-W2 in FIG. 5C2. FIG. 5D1 is a cross-sectional view along a section line W1-W2 in FIG. 5D2.

<Example 1 of Manufacturing Method>

The manufacturing method of a functional panel in this embodiment includes the following four steps (see FIG. 3, FIGS. 4A1, 4A2, 4B1, 4B2, 4C1, and 4C2, FIGS. 5A1, 5A2, 5B, 5C1, 5C2, 5D1, and 5D2).

<<Step 1>>

In a step 1, a first member 91 including a terminal 13b, a wiring 13c, a base 41, a release layer 13a, and a functional layer 13d is prepared (see FIGS. 4A1 and 4A2).

Note that the wiring 13c is electrically connected to the terminal 13b. The base 41 includes a region overlapping with the terminal 13b and a region overlapping with the wiring 13c. The release layer 13a includes a region overlapping with the terminal 13b. The terminal 13b is provided between the release layer 13a and the base 41. The functional layer 13d includes a region overlapping with the base 41. The functional layer 13d includes a functional element. The functional element is electrically connected to the wiring 13c.

A resin layer 31 can be provided between the wiring 13c and the base 41.

In addition, a second member 82 including a separation layer 22 and a layer to be separated 23 is prepared (see FIGS. 4B1 and 4B2).

Note that the layer to be separated 23 includes a region overlapping with the substrate 21 and that the separation layer 22 is provided between the substrate 21 and the layer to be separated 23.

Then, for example, the first member 91 and the second member 82 are bonded to each other using a bonding layer 30 which is in contact with the release layer 13a, with the functional layer 13d, and with a region where the layer to be separated 23 and the separation layer 22 are not formed, so that the release layer 13a of the first member 91 overlaps with a region of the second member 82 where the layer to be separated 23 and the separation layer 22 are not formed In this manner, a process member is obtained (see 51 in FIG. 3 and FIGS. 4C1 and 4C2).

To form the bonding layer 30, any of a variety of methods can be used. For example, a dispensing method, a screen printing method, or the like can be used. The bonding layer 30 is cured by a method selected in accordance with its material. For example, in the case where a photo-curable material is used for the bonding layer 30, the bonding layer 30 is irradiated with light including light of a predetermined wavelength, whereas in the case where a thermosetting material is used for the bonding layer 30, the bonding layer 30 is heated at a predetermined temperature.

Note that the process member after the step 1 includes the release layer 13a, the terminal 13b, the wiring 13c, the functional element, the functional layer 13d, the base 41, the substrate 21, the bonding layer 30, the layer to be separated 23, and the separation layer 22.

The terminal 13b includes a region overlapping with the release layer 13a. The wiring 13c is electrically connected to the terminal 13b. The functional layer 13d includes the functional element. The functional element is electrically connected to the wiring 13c. The base 41 includes a region overlapping with the terminal 13b, the wiring 13c, and the functional layer 13d.

The substrate 21 includes a region overlapping with the base 41. The bonding layer 30 is provided between the base 41 and the substrate 21. The layer to be separated 23 is provided between the substrate 21 and the bonding layer 30. The separation layer 22 is provided between the substrate 21 and the layer to be separated 23.

In the process member after the step 1, the region overlapping with the terminal 13b and the release layer 13a includes the region where the layer to be separated 23 and the separation layer 22 are not formed.

In addition, the resin layer 31 can be provided between the base 41 and the functional layer 13d.

<<Step 2>>

In a step 2, part of the layer to be separated 23 is separated from the substrate 21 to form a separation starting point 91s (see S2 in FIG. 3, and FIGS. 5A1 and 5A2).

Part of the layer to be separated 23 is separated from the substrate 21 at the separation starting point 91s.

To separate part of the layer to be separated 23 from the separation layer 22, for example, the layer to be separated 23 may be pierced or cut with a sharp tip from the base 41 side, or a laser or the like may be used (specifically, a laser ablation method). The separation starting point 91s can be formed by any of these methods.

<<Step 3>>

In a step 3, one part of the bonding layer 30 and the layer to be separated 23 are separated from the other part of the bonding layer 30 and the substrate 21 (see S3 in FIG. 3 and FIG. 5B). Specifically, from the separation starting point 91s formed near the edge of the bonding layer 30, the substrate 21 and the separation layer 22 are separated from the layer to be separated 23 (see FIG. 5B).

As a result, a remaining portion is obtained which includes the layer to be separated 23, the base 41 including the region overlapping with the layer to be separated 23, the bonding layer 30 between the layer to be separated 23 and the base 41, the resin layer 31 between the bonding layer 30 and the base 41, the functional layer 13d between the resin layer 31 and the bonding layer 30, the wiring 13c between the functional layer 13d and the resin layer 31, the terminal 13b electrically connected to the wiring 13c, and the release layer 13a including the region overlapping with the terminal 13b.

Note that the layer to be separated 23 may be separated from the separation layer 22 while the vicinity of the interface between them is irradiated with ions to remove static electricity. Specifically, the ions may be generated by an ionizer.

Furthermore, the layer to be separated 23 may be separated from the separation layer 22 by injecting a liquid into the interface between them. Alternatively, a liquid may be ejected and sprayed by a nozzle 99. For example, as the liquid to be injected or the liquid to be sprayed, water, a polar solvent, or the like can be used. Alternatively, a liquid which dissolves the separation layer may be injected or sprayed.

Injection of a liquid can reduce the influence of static electricity and the like generated with the separation.

The layer to be separated 23 is separated from the separation layer 22 containing tungsten oxide while a liquid containing water is injected or sprayed, which is particularly preferable because stress applied to the layer to be separated 23 owing to the separation can be reduced.

Note that part of the release layer 13a overlaps with the region where the separation layer 22 is not formed in the step 1; thus, when the remaining portion is detached from the substrate 21, the part of the bonding layer 30 in the region overlapping with the release layer 13a can be removed together with the substrate 21, which is advantageous.

In addition, the part of the bonding layer 30 in the region overlapping with the release layer 13a can be removed more easily than part of the bonding layer 30 in the region not overlapping with the release layer 13a; thus, the part of the bonding layer 30 in the region overlapping with the release layer 13a can be removed selectively.

<<Step 4>>

In a step 4, the layer to be separated 23 is bonded with a base 42 using a resin layer 32 (see S4 in FIG. 3 and FIGS. 5C1 and 5C2).

A liquid adhesive can be used as the resin layer 32. Alternatively, an adhesive whose fluidity is reduced and which is formed in a sheet-like shape in advance (also referred to as a sheet-like adhesive) can be used. The use of the sheet-like adhesive can reduce the amount of the adhesive which extends beyond the edge of the layer to be separated 23. In addition, the uniformity in thickness of the resin layer 32 can be easily achieved.

Note that the functional panel after the step 4 includes the terminal 13b, the wiring 13c, the base 41, the base 42, the bonding layer 30, the release layer 13a, and the functional layer 13d (see FIGS. 5D1 and 5D2).

The wiring 13c is electrically connected to the terminal 13b. The base 41 includes the region overlapping with the terminal 13b and the region overlapping with the wiring 13c. The base 42 includes a region overlapping with the base 41. The bonding layer 30 is provided between the base 41 and the base 42. The release layer 13a is provided between the base 41 and the bonding layer 30. The functional layer 13d is provided between the base 41 and the bonding layer 30. The release layer 13a is provided between the wiring 13c and the bonding layer 30. The functional layer 13d includes a functional element. The functional element is electrically connected to the wiring 13c.

In addition, the functional panel includes the resin layer 31, the resin layer 32, and the layer to be separated 23. The layer to be separated 23 is provided between the base 42 and the bonding layer 30. The resin layer 32 is provided between the layer to be separated 23 and the base 42. The resin layer 31 is provided between the wiring 13c and the base 41.

The manufacturing method of a functional panel, which is described in this embodiment, includes the above-described four steps; accordingly, the bonding layer 30 in the region overlapping with the release layer 13a can be selectively detached from the base 41 while preventing the terminal 13b from breaking (the step 3). A manufacturing method of a novel functional panel that is highly convenient or reliable is thus provided.

<Example 2 of Manufacturing Method>

Another example of the manufacturing method of a functional panel of one embodiment of the present invention will be described with reference to FIG. 6 and FIGS. 7A1, 7A2, 7B1, 7B2, 7C, 7D1, 7D2, 7E1, and 7E2.

Figure 6:
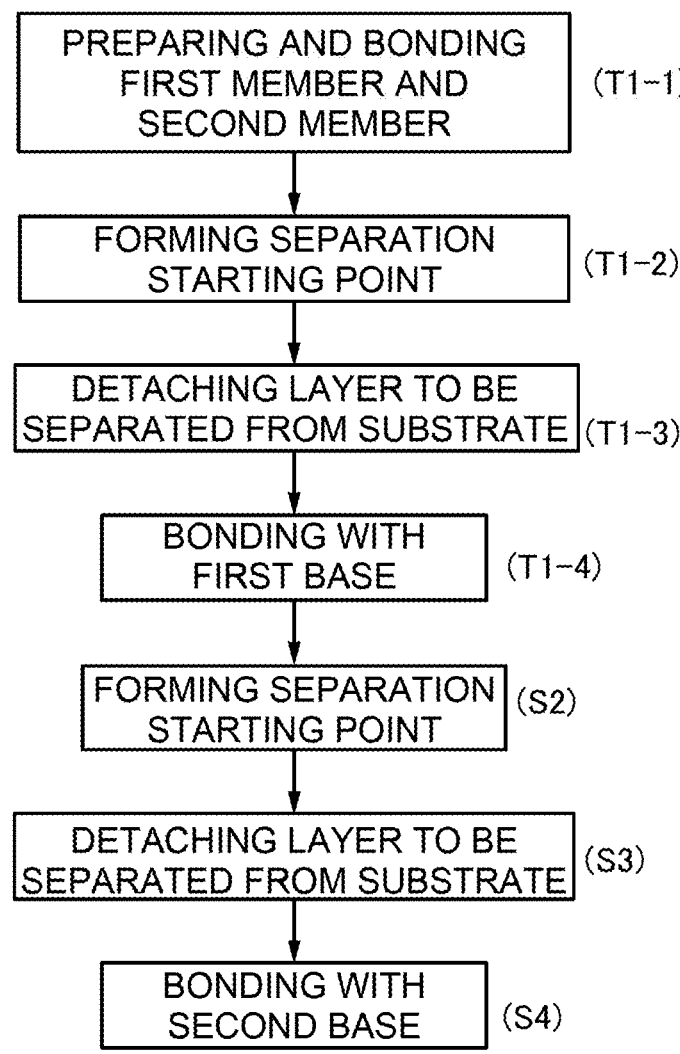
FIG. 6 is a flow chart showing a manufacturing method of a functional panel according to one embodiment.

FIG. 6 is a flow chart showing a modification example of the manufacturing method of a functional panel of one embodiment of the present invention.

FIGS. 7A1, 7A2, 7B1, 7B2, 7C, 7D1, 7D2, 7E1, and 7E2 show the modification example of the manufacturing method of a functional panel of one embodiment of the present invention. FIGS. 7A2, B2, 7D2, and 7E2 are top views of a process member during the manufacturing process. FIG. 7A1 is a cross-sectional view along a section line W1-W2 in FIG. 7A2. FIG. 7B1 is a cross-sectional view along a section line W1-W2 in FIG. 7B2. FIG. 7D1 is a cross-sectional view along a section line W1-W2 in FIG. 7D2. FIG. 7E1 is a cross-sectional view along a section line W1-W2 in FIG. 7E2.

Note that the structure of the first member and the step 1 are different from those in the manufacturing method of a functional panel which are described with reference to FIG. 3, FIGS. 4A1, 4A2, 4B1, 4B2, 4C1, and 4C2, and FIGS. 5A1, 5A2, 5B, 5C1, 5C2, 5D1, and 5D2.

A first member 81 which is used instead of the first member 91 is different from the first member 91 in including a substrate 11 instead of the base 41, a separation layer 12 including a region overlapping with the substrate 11, and a layer to be separated 13e and which includes a region overlapping with the separation layer 12 (see FIGS. 4A1, 4A2, 4B1, 4B2, 4C1, and 4C2 and FIGS. 7A1, 7A2, 7B1, 7B2, 7C, 7D1, 7D2, 7E1, and 7E2). Note that the layer to be separated 13e is separated from the substrate 11 along the separation layer 12.

In addition, the step 1 further includes a step of forming a separation starting point by separating part of the layer to be separated 13e from the substrate 11, a step of separating the substrate 11 to obtain a remaining portion, and a step of bonding the remaining portion to the base 41 using the resin layer 31, which is different from the aforementioned method (see FIG. 3 and FIG. 6).

The different components and steps are described in detail below. Refer to the above-described description for the part where the same components or steps can be employed.

The modification example of the manufacturing method of a functional panel described in this embodiment includes the following four steps before the step 2 (see FIG. 6 and FIGS. 7A1, 7A2, 7B1, 7B2, 7C, 7D1, 7D2, 7E1, and 7E2).

<<Step 1-1>>

In a step 1-1, the first member 81 including the layer to be separated 13e, the substrate 11, and the separation layer 12 is prepared (see FIGS. 7A1 and 7A2).

Note that the substrate 11 includes a region overlapping with the layer to be separated 13e. The separation layer 12 is provided between the layer to be separated 13e and the substrate 11.

The layer to be separated 13e includes the terminal 13b, the release layer 13a including a region overlapping with the terminal 13b, the wiring 13c electrically connected to the terminal 13b, a functional element electrically connected to the wiring 13c, and the functional layer 13d including the functional element.

In addition, a second member 82 including a separation layer 22 and a layer to be separated 23 is prepared.

Note that the layer to be separated 23 includes a region overlapping with the substrate 21 and that the separation layer 22 is provided between the substrate 21 and the layer to be separated 23.

Then, for example, the first member 81 and the second member 82 are bonded to each other using a bonding layer 30 which is in contact with the release layer 13a, with the functional layer 13d, and with a region where the layer to be separated 23 and the separation layer 22 are not formed so that the release layer 13a of the first member 91 overlaps with a region of the second member 82 where the separation layer 22 is not formed. In this manner, a process member is obtained (see T1-1 in FIG. 6).

<<Step 1-2>>

In a step 1-2, part of the layer to be separated 13e is separated from the substrate 11 to form a separation starting point 13s (see T1-2 in FIG. 6, and FIGS. 7B1 and 7B2).

Part of the layer to be separated 13e is separated from the substrate 11 at the separation starting point 13s.

Part of the layer to be separated 13e can be separated from the separation layer 12 by a method of inserting a sharp tip into the layer to be separated 13e from the substrate 11 side, by a method using a laser or the like (specifically, a laser ablation method), or the like. Accordingly, the separation starting point 13s is formed.

<<Step 1-3>>

In a step 1-3, the remaining portion including the layer to be separated 13e is separated from the substrate 11 (see T1-3 in FIG. 6 and FIGS. 7C, 7D1, and 7D2).

Note that when the remaining portion is separated from the substrate 11, the force required to separate the bonding layer 30 from the layer to be separated 13e is applied.

If the force required to separate the bonding layer 30 in the region overlapping with the release layer 13a from the release layer 13a is too smaller than the force required to separate the bonding layer 30 in the region not overlapping with the release layer 13a from the release layer 13a, the bonding layer 30 in the region overlapping with the release layer 13a is separated from the release layer 13a in some cases.

If the bonding layer 30 is separated from the release layer 13a, the mechanical strength of the layer to be separated 13e in the region overlapping with the release layer 13a is lowered; accordingly, the terminal 13b in the region overlapping with the release layer 13a might be broken in the manufacturing process of the functional panel.

If the force required to separate the bonding layer 30 in the region overlapping with the release layer 13a from the release layer 13a is equal to or greater than the force required to separate the bonding layer 30 in the region not overlapping with the release layer 13a from the layer to be separated 13e, the bonding layer 30 in the region overlapping with the release layer 13a cannot be separated from the release layer 13a in some cases.

If the bonding layer 30 cannot be separated from the release layer 13a, electrical connection between the terminal 13b and the conductive member might fail.

Specifically, a material having a force greater than or equal to 1/10 times and smaller than 1 time the force required to separate the bonding layer 30 in the region not overlapping with the release layer 13a from the layer to be separated 13e is used for the release layer 13a.

If a force required to separate the bonding layer 30 in contact with the release layer 13a from the substrate 21 is greater than a force required to separate the region of the bonding layer 30 where the release layer 13a is not provided from the substrate 21, the bonding layer 30 might fail to be detached.

When a force required to separate the bonding layer 30 in contact with the release layer 13a from the substrate 21 is 0.5 N or more, the possibility of detaching the bonding layer 30 by mistake in the manufacturing process is reduced. In addition, when the force is smaller than or equal to 5 N, the bonding layer 30 is detached easily.

Note that the force required to separate the bonding layer 30 in contact with the release layer 13a from the substrate 21 can be measured referring to an adhesive tape/adhesive sheet testing method based on standard number JIS Z0237 of Japanese Industrial Standards (JIS).

Specifically, the force can be measured using a compact table-top universal tester (EZ-TEST EZ-S-50N) manufactured by Shimadzu Corporation, while separating the bonding layer 30 of a sample having the outline of 126 mm in length×25 mm in width from the substrate 21 at an angle (also referred to as a separation angle) of 90° and a rate (also referred to as a separation rate) of 20 mm/min.

<<Step 1-4>>

In a step 1-4, the layer to be separated 13e is bonded with the base 41 using the resin layer 31 so that a region of the base 41 overlaps with the layer to be separated 13e (see T1-4 in FIG. 6 and FIGS. 7E1 and 7E2).

Note that the process member after the step 1-4 has the same structure as the process member after the step 1 described in Example 1 of Manufacturing Method.

<Example 1 of Manufacturing Method of Release Layer>

In this embodiment, a manufacturing method of a release layer that can be used in the manufacturing method of a functional panel of one embodiment of the present invention is described with reference to FIGS. 8A1, 8A2, 8B1, and 8B2.

First, a member including the layer to be separated 13e, the substrate 11, and the separation layer 12 is prepared (see FIGS. 8A1 and 8A2).

Note that the substrate 11 includes the region overlapping with the layer to be separated 13e. The separation layer 12 is provided between the layer to be separated 13e and the substrate 11.

The layer to be separated 13e includes the terminal 13b, the release layer 13a including the region overlapping with the terminal 13b, the wiring 13c electrically connected to the terminal 13b, the functional element electrically connected to the wiring 13c, and the functional layer 13d including the functional element.

Then, the release layer 13a is formed so that the terminal 13b is provided between the release layer 13a and the substrate 11 (see FIGS. 8B1 and 8B2).

For example, to form the release layer 13a, a solution or a dispersion liquid containing acrylic resin or the like whose side chain has a perfluoroalkyl group or the like is applied to the region overlapping with the terminal 13b, and the solvent or the dispersion medium is vaporized.

For example, a cloth impregnated with the solution or the dispersion liquid can be used for the application. Alternatively, an inkjet method or a printing method can be used for the application.

Thus, a material containing a fluorine group is used for the release layer 13a.

Note that the functional layer 13d may be formed after the mold releasing layer 13a is formed. For example, a light-emitting element or the like may be formed in the functional layer 13d after the release layer 13a is formed. Specifically, an electroluminescent element or the like may be formed.

<Example 2 of Manufacturing Method of Release Layer>

For example, a stacked-layer film can be used for the release layer 13a.

Specifically, a structure in which a layer containing a light-emitting organic compound and a layer containing a conductive material are stacked can be used for the release layer 13a.

For example, metal and the layer containing a light-emitting organic compound can be vacuum-evaporated by a resistance heating method. Alternatively, a conductive oxide or the like can be deposited by a sputtering method.

In this manner, the stacked-layer structure containing a light-emitting compound can be used for the release layer 13a.

Note that an organic electroluminescence element may be formed in the functional layer 13d in the same step of forming the release layer 13a. Specifically, a shadow mask whose opening portions are provided in a region overlapping with the functional layer 13d and in a region overlapping with the terminal 13b can be used to form a layer containing a light-emitting organic compound.

<Example 3 of Manufacturing Method>

Another example of the manufacturing method of a functional panel of one embodiment of the present invention is described with reference to FIGS. 9A1, 9A2, 9B1, 9B2, 9C, 9D1, and 9D2 and FIGS. 10A1, 10A2, 10B1, and 10B2.

Note that the structure of the second member and the step 1 are different from those in the manufacturing method of a functional panel which are described with reference to FIG. 3, FIGS. 4A1, 4A2, 4B1, 4B2, 4C1, and 4C2, and FIGS. 5A1, 5A2, 5B, 5C1, 5C2, 5D1, and 5D2 and in including a step 5 after the step 4.

The layer to be separated 23 and the separation layer 22 in a second member 82B which is used instead of the second member 82 is provided in the region overlapping with the release layer 13a of the first member 91, which is bonded in the step 1 (see FIGS. 9A1 and 9A2).

In the step 1, the first member 91 and the second member 82B are bonded to each other using the bonding layer 30 so that the release layer 13a overlaps with the region where the layer to be separated 23 and the separation layer 22 are provided, whereby a process member is obtained (see FIGS. 9B1 and 9B2).

Note that a separation starting point is formed in the step 2. Then, the layer to be separated 23 is separated from the substrate 21 in the step 3 (see FIGS. 9C, 9D1, and 9D2).

In the step 4, the base 42 is bonded to the layer to be separated 23 using the resin layer 32 (see FIGS. 10A1 and 10A2).

The process member obtained after the step 4 includes the bonding layer 30 and the layer to be separated 23 in a region overlapping with the release layer 13a and the terminal 13b, which is different from the process member illustrated in FIGS. 5D1 and 5D2 (see FIGS. 10A1 and 10A2).

<<Step 5>>

In the step 5, an opening is formed in the layer to be separated 23 and the bonding layer 30 in the region overlapping with the release layer 13a (see FIGS. 10B1 and 10B2).

For example, an adhesive tape is bonded to the layer to be separated 23 in the region overlapping with the release layer 13a and is removed, whereby the layer to be separated 23 and the bonding layer 30 in the region overlapping with the release layer 13a are removed together with the adhesive tape. In this manner, an opening reaching the release layer 13a is formed in the layer to be separated 23 and the bonding layer 30 in the region overlapping with the release layer 13a.

Note that this embodiment can be combined with any of the other embodiments in this specification as appropriate.

Embodiment 3

In this embodiment, structures of a display panel and a display module of one embodiment of the present invention will be described with reference to FIGS. 11A and 11B.

FIGS. 11A and 11B illustrate the structures of a display panel and a display module of one embodiment of the present invention. FIG. 11A is a top view of a functional panel of one embodiment of the present invention. FIG. 11B is a cross-sectional view taken along section lines Y1-Y2 and Y3-Y4 in FIG. 11A.

<Structure Example of Display Panel>

A functional panel 500 including a display element 550R can be referred to as a display panel.

In another case, the functional panel 500 includes the terminal 519, a wiring 511 electrically connected to the terminal 519, the first base 510 including a region overlapping with the terminal 519 and a region overlapping with the wiring 511, the second base 570 including a region overlapping with the first base 510, the bonding layer 530 between the first base 510 and the second base 570, the release layer 519S between the first base 510 and the bonding layer 530, and the functional layer 561 between the first base 510 and the bonding layer 530.

The release layer 519S is provided between the wiring 511 and the bonding layer 530. The functional layer 561 includes a display element 550R which is electrically connected to the terminal 519.

With such a structure, a signal or an electric power is supplied to the terminal 519 which is provided between the release layer 519S and the first base 510 so as not to overlap with the bonding layer 530, and is supplied to the display element 550R included in the functional layer 561 which is provided between the first base 510 and the bonding layer 530. Thus, a novel functional panel that is highly convenient or reliable is provided.

Note that a functional layer 562 may be provided between the second base 570 and the bonding layer 530.

Note that the terminal 519 can be electrically connected to a flexible printed circuit board FPC1 using, for example, a conductive member ACF1.

For example, the first base 510 can include an insulating film 510a, a base 510b, and a resin layer 510c sandwiched between the insulating film 510a and the base 510b.

For example, the second base 570 can include an insulating film 570a, a base 570b, and a resin layer 570c sandwiched between the insulating film 570a and the base 570b.

The functional layer 561 can include the display element 550R, a partition 528 having an opening in a region overlapping with the display element 550R, and an insulating layer 521 including a region overlapping with the partition 528.

An insulating layer that suppresses the diffusion of impurities can be used for the functional layer 562. Alternatively, an optical element can be used for the functional layer 562.

Specifically, a coloring layer CF including a region overlapping with the display element 550R and a light-blocking layer BM in which an opening is formed in a region overlapping with the display element 550R can be used.

Individual components included in the functional panel 500 will be described below. Note that these units cannot be clearly distinguished and one unit also serves as another unit or include part of another unit in some cases.

For example, the insulating film 510a included in the first base 510 is part of the first base 510 and can serve as part of or the whole of the functional layer 561.

In addition, for example, the insulating film 570a included in the second base 570 is part of the second base 570 and can serve as part of or the whole of the functional layer 562.

<<Structure Example>>

The functional panel 500 includes the terminal 519, the wiring 511, the first base 510, the bonding layer 530, the release layer 519S, the functional layer 561, and the second base 570.

<<Wiring 511 and Terminal 519>>

For example, the materials which can be used for the wiring 111 or the terminal 119, which are described in Embodiment 5, can be used for the wiring 511 or the terminal 519.

<<First Base 510>>

For example, the material which can be used for the base 110 described in Embodiment 1 can be used for the first base 510.

<<Second Base 570>>

For example, the material which can be used for the base 170 described in Embodiment 1 can be used for the second base 570.

<<Bonding Layer 530>>

For example, the material which can be used for the bonding layer 130 described in Embodiment 1 can be used for the bonding layer 530.

<<First Region A1 and Second Region A2>>

In addition, the functional panel 500 described in this embodiment includes a first region A1 in which the release layer 519S is provided between the first base 510 and the bonding layer 530, and a second region A2 which is adjacent to the first region A1 and in which the release layer 519S is not provided between the first base 510 and the bonding layer 530 (see FIG. 11B).

A force required to separate the bonding layer 530 in the first region A1 from the first base 510 is greater than or equal to 1/10 times and smaller than 1 time a force required to separate the bonding layer 530 in the second region A2 from the first base 510.

Alternatively, a force required to separate the bonding layer 530 in the first region A1 from the first base 510 is greater than or equal to 0.03 N and smaller than or equal to 8.0 N.

With the structure, the bonding layer 530 in the region overlapping with the release layer 519S can be selectively detached from the first base 510 while preventing the terminal 519 from breaking. Thus, a novel functional panel that is highly convenient or reliable is provided.

<<Release Layer 519S>>

The release layer 519S can have various structures. For example, the material of the release layer 119S described in Embodiment 1 can be used.

<<Functional Layer 561>>

For example, a layer including one or more of a functional element, a functional circuit, an optical element, a functional film, or the like, which can be used for the functional layer 161 and described in Embodiment 1, can be used for the functional layer 561.

Specifically, the functional layer 161 of one embodiment of the present invention further includes a pixel 502 supplied with a control signal and an image signal, a region 501 in which the pixels 502 are arranged, a driver circuit GD which supplies the control signal, a driver circuit SD which supplies the image signal, a wiring 511 electrically connected to the driver circuit SD, and the terminal 519 electrically connected to the wiring 511 (see FIGS. 11A and 11B).

The pixel 502 includes a plurality of subpixels (e.g., subpixel 502R) and the like. Note that subpixels which have a function of displaying a variety of colors can be used. Specifically, a subpixel which has a function of displaying red can be used as the subpixel 502R. Moreover, subpixels which have a function of displaying green, blue, and the like can be used for the pixel 502.

The subpixel 502R includes the display element 550R, the coloring layer CF including a region overlapping with the display element 550R, and a pixel circuit between the first base 510 and a layer 553 containing a light-emitting organic compound (see FIG. 11B).

The pixel circuit has a function of supplying electric power to the display element 550R in response to a control signal and an image signal. For example, a driving transistor MO or a capacitor can be used for the pixel circuit.

The display element 550R includes a first electrode 551R and a second electrode 552 which are supplied with electric power, and a layer 553 containing a light-emitting organic compound between the first electrode 551R and the second electrode 552.

The first electrode 551R is electrically connected to a source electrode or a drain electrode of the driving transistor MO.

Specifically, a variety of sequential circuit, such as a shift register, can be used as the driving circuit GD or the driving circuit SD. The driver circuit SD includes a transistor MD or a capacitor CD. For example, a transistor which can be formed in the same process as the driving transistor MO can be used as the transistor MD.

For example, in this specification and the like, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, a metal insulator metal (MIM), a thin film diode (TFD), or the like can be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

Alternatively, one embodiment of the present invention can be used for a lighting device not including a pixel.

<<Functional Layer 562>>

For example, a layer including one or more of a functional element, a functional circuit, an optical element, a functional film, or the like, which can be used for the functional layer 161 and described in Embodiment 1, can be used for the functional layer 562.

Specifically, the coloring layer CF including the region overlapping with the display element 550R and the light-blocking layer BM in which an opening is formed in the region overlapping with the display element 550R can be used for the functional layer 562 (see FIG. 11B).

<<Other Components>>

Furthermore, the display module of one embodiment of the present invention includes a functional film 570p which has a region overlapping with the pixel 502. For example, a polarizing plate can be used for the functional film 570p.

<Structure Example of Light-Emitting Module>

A light-emitting module described in this embodiment includes the functional panel 500, the flexible printed circuit board FPC1 including a region overlapping with the terminal 519 of the functional panel 500, and the conductive member ACF1 between the functional panel 500 and the flexible printed circuit board FPC1.

The functional panel 500 includes the display element 550R. The flexible printed circuit board FPC1 includes the wiring PW. The conductive member ACF1 electrically connects the terminal 519 and the wiring PW.

The conductive member ACF1 contains the conductive particle CP. The conductive particle CP electrically connects the terminal 519 and the wiring PW.

<<Printed Circuit Board>>

For example, the material that can be used for the flexible printed circuit board FPC1 described in Embodiment 1 can be used for a printed circuit board.

<<Conductive Member>>

For example, the material that can be used for the conductive member ACF1 described in Embodiment 1 can be used for a conductive member.

Note that this embodiment can be combined with any of the other embodiments in this specification as appropriate.

Embodiment 4

In this embodiment, the structures of a location data input panel and a location data input module of one embodiment of the present invention are described with reference to FIGS. 12A and 12B and FIGS. 13A to 13C.

FIGS. 12A and 12B and FIGS. 13A to 13C illustrate the structures of the location data input panel and the location data input module of one embodiment of the present invention.

FIG. 12A is a top view of the location data input panel of one embodiment of the present invention. FIG. 12B is a cross-sectional view taken along section lines X1-X2 and X3-X4 in FIG. 12A.

Figure 13B:
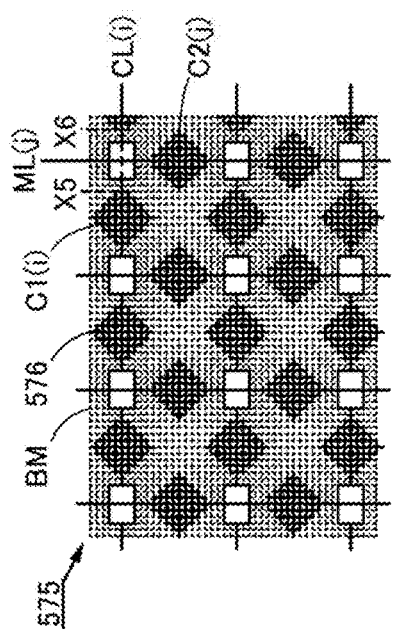
FIGS. 13A, 13B, and 13C illustrate a structure of a touch panel according to one embodiment.
Figure 13C:
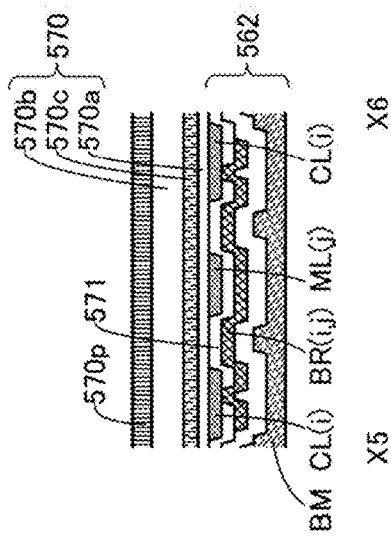
Figure 13A:
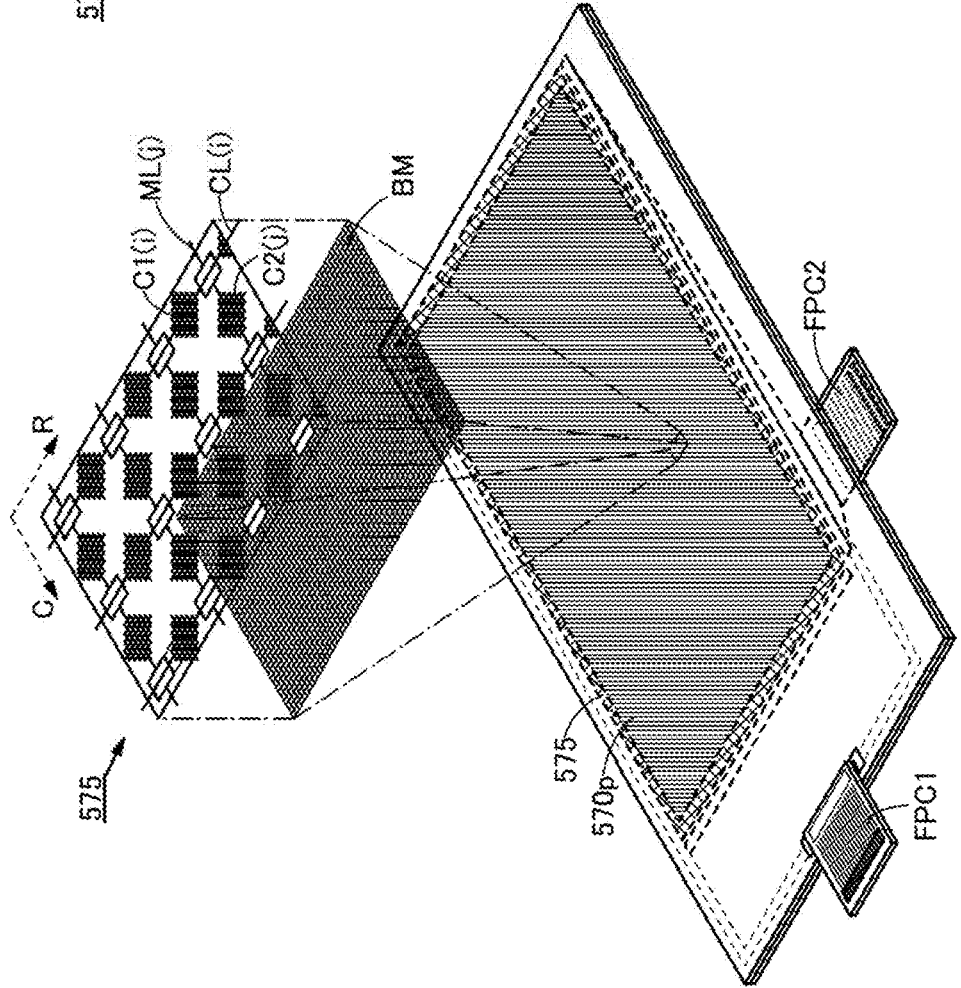

FIG. 13A is a projection view of the location data input panel of one embodiment of the present invention. Note that for convenience of description, part of the location data input panel is enlarged. FIG. 13B is a top view of a proximity sensor of the location data input panel. FIG. 13C is a cross-sectional view taken along a section line X5-X6 in FIG. 13B.

<Structure Example of Location Data Input Panel>

A functional panel 500TP including a proximity sensor 575 can be referred to as a location data input panel. The functional panel 500TP including the proximity sensor 575 and the display element 550R can be referred to as a touch panel.

The functional panel 500TP is different from the functional panel 500 which is described with reference to FIGS. 11A and 11B in including a terminal 579, in including a wiring 578 electrically connected to the terminal 579, in including a release layer 579S between the second base 570 and the bonding layer 530, and in the structure of the functional layer 562 (see FIG. 12B). The different compositions are described in detail below, and the above description is referred to for the other similar components.

Note that the functional layer 562 includes the proximity sensor 575 electrically connected to the wiring 578.

With such a structure, a signal or an electric power is supplied to the terminal 579 which is provided between the release layer 579S and the second base 570 so as not to overlap with the bonding layer 530, and is supplied to the proximity sensor 575 included in the functional layer 562 which is provided between the second base 570 and the bonding layer 530. Thus, a novel functional panel that is highly convenient or reliable is provided.

<<Structure Example>>

The functional panel 500TP includes the terminal 519, the wiring 511, the first base 510, the bonding layer 530, the release layer 519S, the functional layer 561, the second base 570, the terminal 579, the wiring 578, the release layer 579S, or the proximity sensor 575.

<<Wiring 578 and Terminal 579>>

For example, the materials which can be used for the wiring 111 or the terminal 119, which are described in Embodiment 5, can be used for the wiring 578 or the terminal 579.

<<First Region B1 and Second Region B2>>

In addition, the functional panel 500TP described in this embodiment includes a first region B1 in which the release layer 579S is provided between the second base 570 and the bonding layer 530, and a second region B2 which is adjacent to the first region B1 and in which the release layer 579S is not provided between the second base 570 and the bonding layer 530 (see FIG. 12B).

A force required to separate the bonding layer 530 in the first region B1 from the second base 570 is greater than or equal to 1/10 times and smaller than 1 time a force required to separate the bonding layer 530 in the second region B2 from the second base 570.

Alternatively, a force required to separate the bonding layer 530 in the first region B1 from the second base 570 is greater than or equal to 0.03 N and smaller than or equal to 8.0 N.

With the structure, the bonding layer 530 in the region overlapping with the release layer 579S can be selectively detached from the second base 570 while preventing the terminal 579 from breaking. Thus, a novel functional panel that is highly convenient or reliable is provided.

<<Release Layer 579S>>

The release layer 579S can have various structures. For example, the material of the release layer 119S described in Embodiment 1 can be used.

<<Proximity Sensor 575>>

A sensing element for sensing capacitance, illuminance, magnetic force, a radio wave, pressure, or the like and supplying a signal based on the sensed physical quantity can be used for the functional layer.

For example, a conductive film, a photoelectric conversion element, a magnetic sensing element, a piezoelectric element, a resonator, or the like can be used as the sensing element.

For example, a sensing circuit configured to supply a signal that varies on the basis of the parasitic capacitance of a conductive film can be used for the functional layer. A control signal is supplied to a first electrode, and the potential of a second electrode which changes on the basis of the supplied control signal and the capacitance is obtained and can be supplied as a sensing signal. Thus, a finger or the like which approaches the conductive film in the air can be sensed with change in capacitance.

For example, a first electrode C1($i$) and a second electrode C2($j$) including a region not overlapping with the first electrode C1($i$) can be used as the proximity sensor 575 (see FIGS. 13A and 13B). Note that i and j are natural numbers of 1 or more.

Specifically, the proximity sensor 575 includes the first electrode C1($i$) electrically connected to a control line CL(i) extended in a row direction (a direction indicated by the arrow R in FIG. 13A) and the second electrode C2($j$) electrically connected to a signal line ML(j) extended in a column direction (a direction indicated by the arrow C in FIG. 13A).

For the first electrode C1(*i*) or the second electrode C2(*j*), a conductive film whose light-transmitting regions overlap with the pixels 502 or the subpixels 502R can be used, for example.

For the first electrode C1(*i*) or the second electrode C2(*j*), a net-conductive film whose openings 576 overlap with the pixels 502 or the subpixels 502R can be used, for example.

The control line CL(i) includes the wiring BR(i,j). In the wiring BR(i,j), the control line CL(i) intersects with the signal line ML(j) (see FIG. 13C). An insulating film 571 is provided between the wiring BR(i,j) and the signal line ML(j) (see FIG. 11B). Thus, a short circuit between the wiring BR(i,j) and the signal line ML(j) can be prevented.

Note that the control line CL(i) or the signal line ML(j) is electrically connected to the terminal 579. For example, the control line CL(i) and the signal line ML(j) can supply a control signal and a sensing signal, respectively.

<Structure Example of Location Data Input Module>

A location data input module described in this embodiment includes the functional panel 500TP, the flexible printed circuit board FPC2 including a region overlapping with the terminal 579 of the functional panel 500TP, and the conductive member ACF2 between the functional panel 500TP and the flexible printed circuit board FPC2 (see FIGS. 12A and 12B).

The functional panel 500TP includes the proximity sensor 575. The flexible printed circuit board FPC2 includes the wiring PW. The conductive member ACF2 electrically connects the terminal 579 and the wiring PW.

The conductive member ACF2 contains the conductive particle CP. The conductive particle CP electrically connects the terminal 519 and the wiring PW.

<<Printed Circuit Board>>

For example, the material that can be used for the flexible printed circuit board FPC1 described in Embodiment 1 can be used for a printed circuit board.

<<Conductive Member>>

For example, the material that can be used for the conductive member ACF1 described in Embodiment 1 can be used for a conductive member.

Note that this embodiment can be combined with any of the other embodiments in this specification as appropriate.

Embodiment 5

In this embodiment, a device including a functional panel of one embodiment of the present invention is described with reference to FIGS. 14A to 14C, FIGS. 15A to 15E, and FIGS. 16A to 16D.

<<Light-Emitting Device>>

A light-emitting device of one embodiment of the present invention is described with reference to FIGS. 14A to 14C.

Figure 14A:
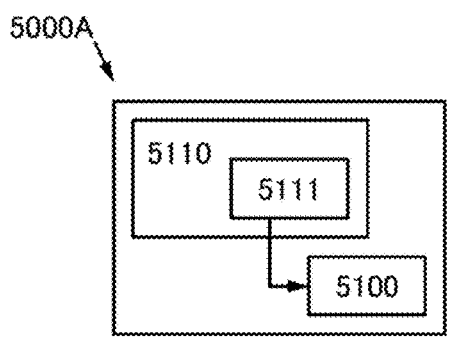
FIGS. 14A, 14B, and 14C show a structure of a light-emitting device according to one embodiment.
Figure 14B:
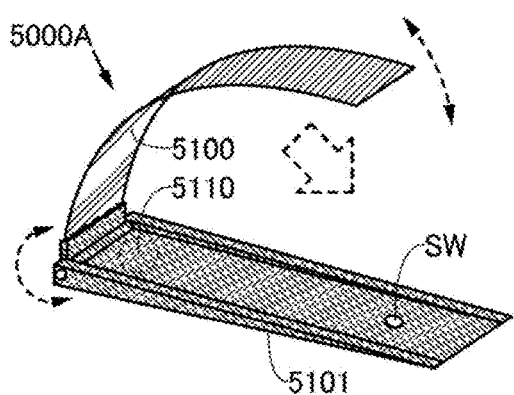
Figure 14C:
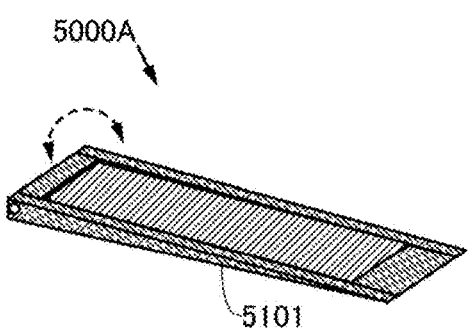

FIG. 14A is a block diagram illustrating a light-emitting device 5000A. FIGS. 14B and 14C are projection views illustrating the light-emitting device 5000A of one embodiment of the present invention.

The light-emitting device 5000A illustrating one embodiment of the present invention includes a light-emitting module 5100 and a driver portion 5110 electrically connected to the light-emitting module 5100. The driver portion 5110 includes a constant current supply 5111 (see FIG. 14A).

The light-emitting device 5000A includes a housing 5101. The housing 5101 supports the light-emitting module 5100, the driver portion 5110, and a switch SW.

For example, a rotatable member can be used as a member of the housing 5101 for supporting the light-emitting module 5100. Specifically, a hinge can be used as the rotatable member. The light-emitting module 5100 supported using the rotatable member can stand up and be folded (see FIGS. 14B and 14C).

The light-emitting device 5000A includes a functional panel of one embodiment of the present invention. For example, the functional panel 100 described in Embodiment 1 can be used.

With the structure, an electric power is supplied to the terminal which is provided between the release layer and the first base so as not to overlap with the bonding layer, and is supplied to the light-emitting element included in the functional layer which is provided between the first base and the bonding layer. Thus, the novel, highly convenient or reliable light-emitting device is provided.

<<Display Device>>

A display device of one embodiment of the present invention is described with reference to FIGS. 15A to 15E.

Figure 15A:
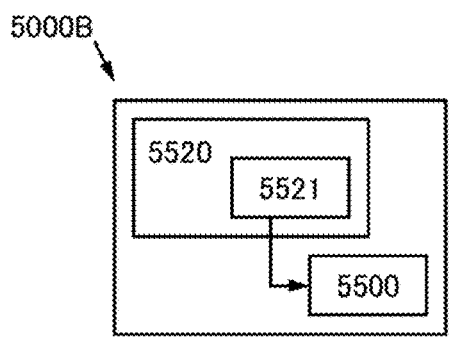
FIGS. 15A, 15B, 15C, 15D, and 15E illustrate a structure of a display device according to one embodiment.
Figure 15B:
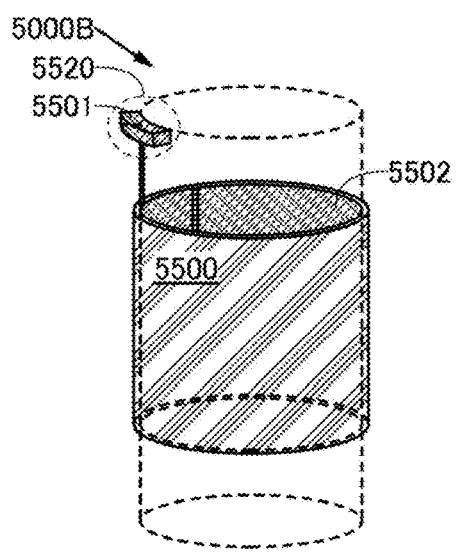
Figure 15C:
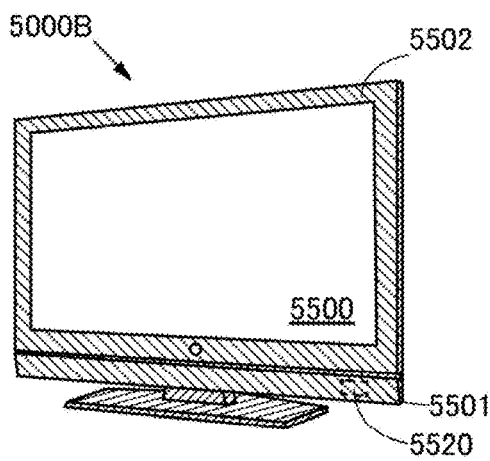
Figure 15D:
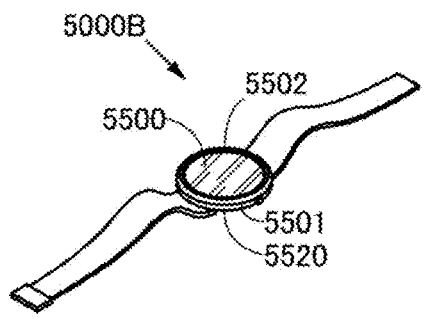
Figure 15E:
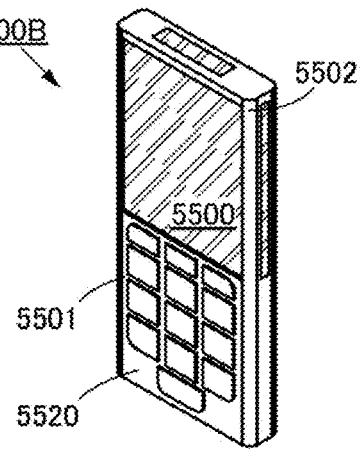

FIG. 15A is a block diagram illustrating a display device 5000B of one embodiment of the present invention. FIGS. 15B to 15E are projection views illustrating the display device 5000B of one embodiment of the present invention.

The display device 5000B of one embodiment of the present invention includes a display module 5500 and a driver portion 5520 electrically connected to the display module 5500. The driver portion 5520 includes a timing signal generation circuit 5521 (see FIG. 15A).

In addition, the display device 5000B includes a housing 5501 and a housing 5502. The housing 5501 houses the driver portion 5520. The housing 5502 supports the display module 5500.

As the housing 5502, a housing having an outer shape along a cylindrical column can be used, for example. With the structure, the display module can be supported with the curved state (see FIG. 15B). For example, the display module can be mounted on a column of a building to display advertisements.

For example, the display module described in Embodiment 2 can be used as the display module 5500.

For the timing signal generation circuit 5521, a circuit for supplying a signal selecting a scan line, a start pulse of a shift register, or the like can be used, for example.

With the structure, a signal or an electric power is supplied to the terminal which is provided between the release layer and the first base so as not to overlap with the bonding layer, and is supplied to the functional layer which is provided between the base and the bonding layer. Thus, a novel display device that is highly convenient or reliable is provided.

<<Data Processing Device>>

A data processing device of one embodiment of the present invention is described with reference to FIGS. 16A to 16D.

Figure 16A:
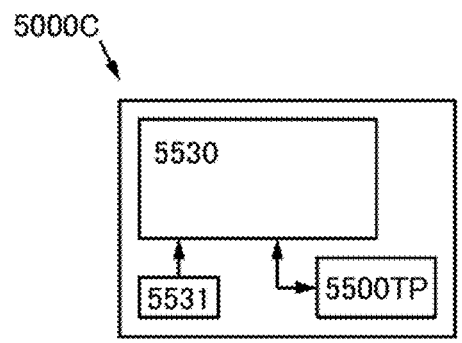
FIGS. 16A, 16B, 16C, and 16D illustrate a structure of a data processing device according to one embodiment.
Figure 16B:
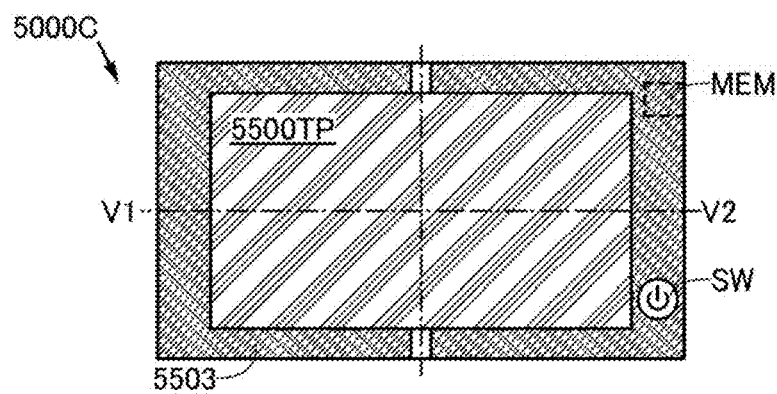
Figure 16C:
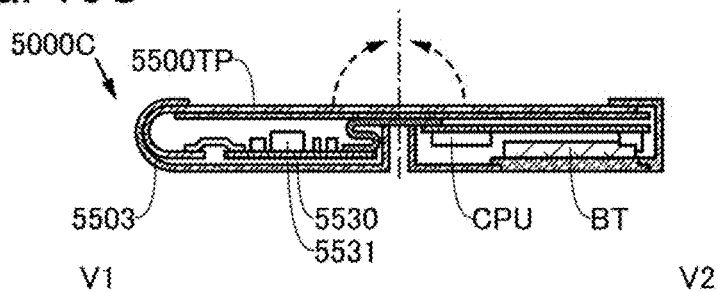
Figure 16D:
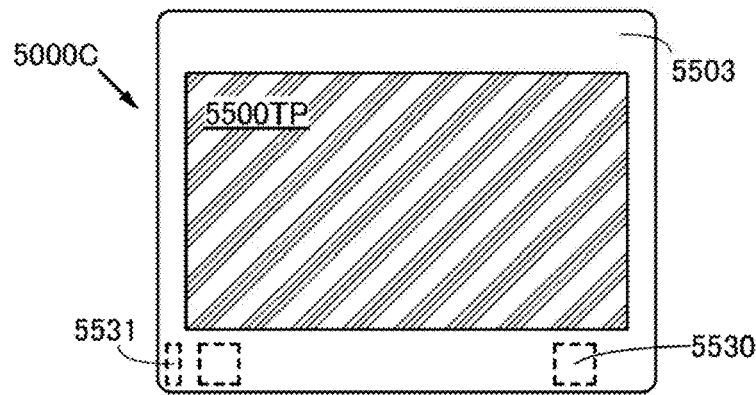

FIG. 16A is a block diagram illustrating a data processing device 5000C of one embodiment of the present invention. FIG. 16B is a top view illustrating the data processing device 5000C of one embodiment of the present invention. FIG. 16C is a cross-sectional view of the data processing device 5000C taken along a section line V1-V2 in FIG. 16B.

The data processing device 5000C illustrating this embodiment includes a location data input module 5500TP, a driver portion 5530 electrically connected to the location data input module 5500TP, and a sensing circuit 5531 electrically connected to the driver portion 5530 (see FIG. 16C).

In addition, the data processing device 5000C includes a housing 5503. The housing 5503 supports the location data input module 5500TP and the driver portion 5530. For example, a housing that can be folded in half can be used.

The data processing device 5000C includes a functional panel of one embodiment of the present invention. For example, the functional panel 500TP described in Embodiment 4 can be used.

The sensing circuit 5531 includes a sensor and senses the state of the data processing device 5000C. For example, the sensing circuit 5531 senses the inclination of the data processing device 5000C, the surrounding brightness, or whether or not the foldable housing is folded.

In addition, the data processing device 5000C includes an arithmetic unit CPU, a memory unit MEM which stores a program to be executed by the arithmetic unit CPU, and a power source BT which supplies electric power for driving the arithmetic unit CPU.

A battery can be used as the power source BT, for example.

The housing 5503 houses the arithmetic unit CPU, the memory unit MEM, a switch SW, the battery BT, and the like.

With the structure, a signal sensed by the proximity sensor is supplied to the conductive particle electrically connected to the terminal which is provided between the release layer and the first base so as not to overlap with the bonding layer, and is supplied to the sensing circuit. Thus, a novel data processing device that is highly convenient or reliable is provided.

Note that this embodiment can be combined with any of the other embodiments in this specification as appropriate.

Example

In this example, the structure of a display module of one embodiment of the present invention, which was fabricated, is described with reference to FIGS. 17A and 17B and FIGS. 18A, 18B1, 18B2, 18C1, and 18C2.

Figure 17A:
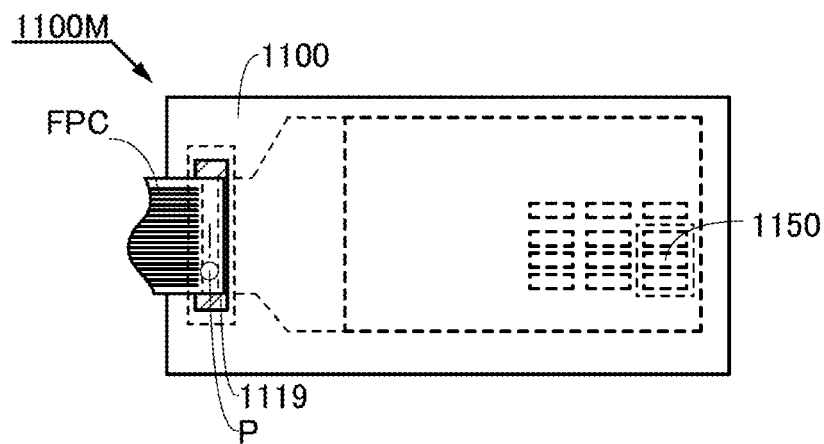
FIGS. 17A and 17B illustrate a structure of a display module according to one example.

FIG. 17A is a schematic view illustrating the structure of a display module 1100M which was fabricated.

Figure 17B:
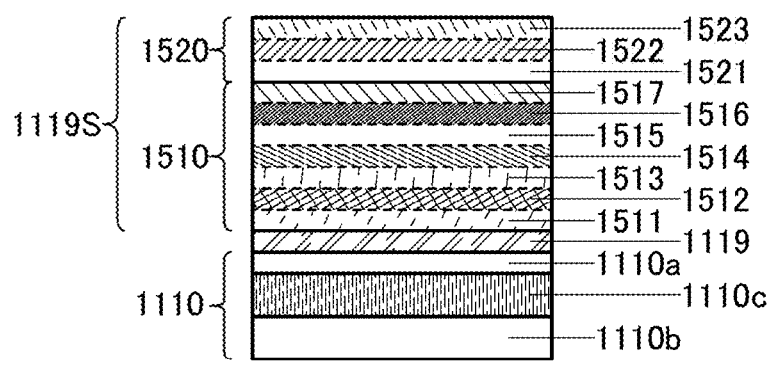

FIG. 17B illustrates the structure of a terminal 1119, a release layer 1119S including a region overlapping with the terminal 1119, and the first base 1110 including a region overlapping with the terminal 1119.

FIG. 18A is an optical micrograph of an appearance of a round region P in FIG. 17A. Note that the optical micrograph was taken from the base 1110 side.

FIG. 18B1 is an electron micrograph showing a cross-sectional structure of a portion between P3 and P4 indicated by the arrows in FIG. 18A. FIG. 18B2 is an image showing the detail of a region in a dashed-line rectangle in FIG. 18B1. Note that the cross section was formed using FIB and observed using a scanning transmission electron microscope (SIMS).

FIG. 18C1 is an electron microscope image showing a cross-sectional structure of a portion between P5 and P6 indicated by the arrows in FIG. 18A. FIG. 18C2 is an image showing the detail of a region in a dashed-line rectangle in FIG. 18C1.

<Display Module 1100M>

The display module 1100M includes a display panel 1100, a flexible printed circuit board FPC, and an anisotropic conductive film (see FIG. 17A).

The display panel 1100 includes the terminal 1119 and the release layer 1119S in a region overlapping with the terminal 1119. In addition, the display panel 1100 includes a light-emitting element 1150 electrically connected to the terminal 1119.

The anisotropic conductive film is provided between the terminal 1119 and the flexible printed circuit board FPC and is thermocompressed with the terminal 1119 and the flexible printed circuit board FPC. Note that the anisotropic conductive film contains conductive particles and resin dispersing the conductive particles.

<<First Base 1110>>

A stacked-layer material in which the first base 1110b, a resin layer 1110c, and an insulating film 1110a were stacked in this order was used for the first base 1110 (see FIG. 17B).

An aramid film was used for the first base 1110b. Epoxy resin was used for the resin layer 1110c.

A film including a stacked-layer material in which a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film were stacked in this order was used as the insulating film 1110a.

<<Terminal>>

A stacked-layer material in which an aluminum film and a titanium film were stacked in this order was used for the terminal 1119.

<<Release Layer>>

A structure including a first layer 1510 and a second layer 1520 including a region overlapping with the first layer 1510 was used for the release layer 1119S. The thickness of the first layer 1510 was 74.6 nm. The thickness of the second layer 1520 was 86 nm. The thickness of the release layer 1119S was 160.6 nm.

A stacked-layer structure in which layers 1511 to 1517 were stacked in this order was used for the first layer 1510. The first layer 1510 contains a light-emitting organic compound. Note that a resistance heating evaporation system was used for forming the layer 1511 to the layer 1517.

A stacked-layer structure in which layers 1521 to 1523 were stacked in this order was used for the second layer 1520. A layer containing lithium fluoride was used as the layer 1521. A layer containing a silver-magnesium alloy was used as the layer 1522. A layer containing an indium tin oxide was used as the layer 1523. Note that a resistance heating evaporation system was used for forming the layer 1521 and the layer 1522. A sputtering apparatus was used for forming the layer 1523.

<<Light-Emitting Element>>

The light-emitting element 1150 includes the structure of the release layer 1119S.

<<Conductive Particle>>

A filler coated with a layer containing nickel and gold was used for a conductive particle CP(1).

<<Evaluation Results>>

A terminal 1119(1) and the conductive particle CP(1) in contact with the terminal 1119(1) were observed (see FIG. 18B1 or FIG. 18B2).

A terminal 1119(2) and a conductive particle CP(2) in contact with the terminal 1119(2) were observed (see FIG. 18C1 or FIG. 18C2).

Note that by the thermocompression, the conductive particle CP(1) and the conductive particle CP(2) were pressed.

In addition, the release layer 1119S was not observed between the terminal 1119(1) and the conductive particle CP(1). In addition, the release layer 1119S was not observed between the terminal 1119(2) and the conductive particle CP(2).

Resin flows by thermocompression bonding. It is thus presumed that the release layer 1119S flowed with the resin.

The terminal 1119 and the flexible printed circuit board FPC were electrically connected with each other through the conductive particle, so that a signal was able to be supplied from the flexible printed circuit board FPC to the display panel 1100.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is included in the drawings or the texts.

Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to a part of Z1 and another part of Z1 is directly connected to X while a drain (or a second terminal or the like) of the transistor is directly connected to a part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are only examples and one embodiment of the present invention is not limited to the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial no. 2015-026317 filed with Japan Patent Office on Feb. 13, 2015, the entire contents of which are hereby incorporated by reference.

What is claimed is:

1. A functional panel comprising:
a release layer;
a first base comprising a region overlapping with the release layer;
a terminal between the release layer and the first base;
a second base comprising a region overlapping with the first base;
a bonding layer between the first base and the second base; and
a functional layer between the first base and the bonding layer,
wherein the functional layer comprises a functional element, and
wherein the functional element is electrically connected to the terminal.

2. The functional panel according to claim 1, further comprising:
a first region; and
a second region,
wherein in the first region, the release layer is provided between the first base and the bonding layer,
wherein the second region is adjacent to the first region,
wherein in the second region, the release layer is not provided between the first base and the bonding layer, and
wherein a force required to separate the bonding layer in the first region from the first base is greater than or equal to $1/10$ times and smaller than 1 time a force required to separate the bonding layer in the second region from the first base.

3. The functional panel according to claim 1, further comprising:
a first region; and
a second region,
wherein in the first region, the release layer is provided between the first base and the bonding layer,
wherein the second region is adjacent to the first region,
wherein in the second region, the release layer is not provided between the first base and the bonding layer, and
wherein a force required to separate the bonding layer in the first region from the first base is greater than or equal 0.03 N and smaller than or equal to 8.0 N.

4. The functional panel according to claim 1, wherein the release layer comprises a water contact angle of more than or equal to 90° and less than 180°.

5. The functional panel according to claim 1, wherein the release layer comprises a fluorine-containing group.

6. A functional module comprising:
the functional panel according to claim 1;
a printed circuit board comprising a region overlapping with the terminal of the functional panel; and
a conductive member between the functional panel and the printed circuit board,
wherein the printed circuit board includes a wiring,
wherein the conductive member comprises a conductive particle, and
wherein the conductive particle electrically connects the terminal and the wiring with each other.

7. A light-emitting module comprising:
the functional panel according to claim 1;
a printed circuit board comprising a region overlapping with the terminal of the functional panel; and
a conductive member between the functional panel and the printed circuit board,
wherein the functional panel includes a light-emitting element,
wherein the printed circuit board includes a wiring, and
wherein the conductive member electrically connects the terminal and the wiring with each other.

8. A light-emitting device comprising:
the light-emitting module according to claim 7; and
a driver portion electrically connected to the light-emitting module,
wherein the driver portion includes a constant current power supply.

9. A display module comprising:
the functional panel according to claim 1;
a printed circuit board comprising a region overlapping with the terminal of the functional panel; and
a conductive member between the functional panel and the printed circuit board,
wherein the functional panel includes a display element,
wherein the printed circuit board includes a wiring, and
wherein the conductive member electrically connects the terminal and the wiring with each other.

10. A display device comprising:
the display module according to claim 9; and
a driver portion electrically connected to the display module,
wherein the driver portion includes a timing signal generation circuit.

11. A location data input module comprising:
the functional panel according to claim 1;
a printed circuit board comprising a region overlapping with the terminal of the functional panel; and
a conductive member between the functional panel and the printed circuit board,
wherein the functional panel includes a proximity sensor,
wherein the printed circuit board includes a wiring, and
wherein the conductive member electrically connects the terminal and the wiring with each other.

12. A data processing device comprising:
the location data input module according to claim 11;
a driver portion electrically connected to the location data input module; and
a sensing circuit, wherein the driver portion is electrically connected to the sensing circuit.

13. A functional panel comprising:
a terminal;
a wiring electrically connected to the terminal;
a first base comprising a region overlapping with the terminal and a region overlapping with the wiring;
a second base comprising a region overlapping with the first base;
a bonding layer between the first base and the second base;
a release layer between the wiring and the bonding layer; and
a functional layer between the first base and the bonding layer,
wherein the functional layer comprises a functional element, and
wherein the functional element is electrically connected to the wiring.

14. The functional panel according to claim 13, further comprising:
a first region; and
a second region,
wherein in the first region, the release layer is provided between the first base and the bonding layer,
wherein the second region is adjacent to the first region,
wherein in the second region, the release layer is not provided between the first base and the bonding layer, and
wherein a force required to separate the bonding layer in the first region from the first base is greater than or equal to $1/10$ times and smaller than 1 time a force required to separate the bonding layer in the second region from the first base.

15. The functional panel according to claim 13, further comprising:
a first region; and
a second region,
wherein in the first region, the release layer is provided between the first base and the bonding layer,
wherein the second region is adjacent to the first region,
wherein in the second region, the release layer is not provided between the first base and the bonding layer, and
wherein a force required to separate the bonding layer in the first region from the first base is greater than or equal 0.03 N and smaller than or equal to 8.0 N.

16. The functional panel according to claim 13, wherein the release layer comprises a water contact angle of more than or equal to 90° and less than 180°.

17. The functional panel according to claim 13, wherein the release layer comprises a fluorine-containing group.

18. A functional module comprising:
the functional panel according to claim 13;
a printed circuit board comprising a region overlapping with the terminal of the functional panel; and
a conductive member between the functional panel and the printed circuit board,
wherein the printed circuit board includes a wiring,
wherein the conductive member comprises a conductive particle, and
wherein the conductive particle electrically connects the terminal and the wiring with each other.

19. A light-emitting module comprising:
the functional panel according to claim 13;
a printed circuit board comprising a region overlapping with the terminal of the functional panel; and
a conductive member between the functional panel and the printed circuit board,
wherein the functional panel includes a light-emitting element,
wherein the printed circuit board includes a wiring, and
wherein the conductive member electrically connects the terminal and the wiring with each other.

20. A light-emitting device comprising:
the light-emitting module according to claim 19; and
a driver portion electrically connected to the light-emitting module,
wherein the driver portion includes a constant current power supply.

21. A display module comprising:
the functional panel according to claim 13;
a printed circuit board comprising a region overlapping with the terminal of the functional panel; and
a conductive member between the functional panel and the printed circuit board,
wherein the functional panel includes a display element,
wherein the printed circuit board includes a wiring, and
wherein the conductive member electrically connects the terminal and the wiring with each other.

22. A display device comprising:
the display module according to claim 21; and
a driver portion electrically connected to the display module,
wherein the driver portion includes a timing signal generation circuit.

23. A location data input module comprising:
the functional panel according to claim 13;
a printed circuit board comprising a region overlapping with the terminal of the functional panel; and
a conductive member between the functional panel and the printed circuit board,
wherein the functional panel includes a proximity sensor,
wherein the printed circuit board includes a wiring, and
wherein the conductive member electrically connects the terminal and the wiring with each other.

24. A data processing device comprising:
the location data input module according to claim 23;
a driver portion electrically connected to the location data input module; and
a sensing circuit,
wherein the driver portion is electrically connected to the sensing circuit.

25. A manufacturing method of a functional panel, the manufacturing method comprising the steps of:
preparing a first member and a second member, the first member comprising:
a terminal,
a wiring electrically connected to the terminal,
a first base comprising a region overlapping with the terminal and a region overlapping with the wiring,
a release layer comprising a region overlapping with the terminal, and
a functional layer comprising a region overlapping with the first base and a functional element,
wherein the functional element is electrically connected to the wiring, and
the second member comprising:
a substrate,
a layer to be separated comprising a region overlapping with the substrate, and
a separation layer between the substrate and the layer to be separated;

bonding the first member and the second member using a bonding layer which is in contact with the release layer, with the functional layer, and with a region where the layer to be separated and the separation layer are not formed so that the release layer of the first member overlaps with the region where the layer to be separated and the separation layer is not formed;

forming a separation starting point by detaching part of the layer to be separated from the substrate;

detaching one part of the bonding layer and the layer to be separated from the other part of the bonding layer and the substrate; and bonding a second base to the layer to be separated using a resin layer.

* * * * *